United States Patent
Otaki et al.

(10) Patent No.: US 8,431,289 B2
(45) Date of Patent: *Apr. 30, 2013

(54) PHOTOSENSITIVE COMPOSITION FOR VOLUME HOLOGRAM RECORDING, PHOTOSENSITIVE MEDIUM FOR VOLUME HOLOGRAM RECORDING AND VOLUME HOLOGRAM

(75) Inventors: Hiroyuki Otaki, Tokyo (JP); Toshio Yoshihara, Tokyo (JP); Yoshihito Maeno, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 46 days.

This patent is subject to a terminal disclaimer.

(21) Appl. No.: 12/825,867

(22) Filed: Jun. 29, 2010

(65) Prior Publication Data

US 2010/0266936 A1 Oct. 21, 2010

Related U.S. Application Data

(63) Continuation of application No. 10/615,041, filed on Jul. 8, 2003, now Pat. No. 7,824,822.

(30) Foreign Application Priority Data

Jul. 12, 2002 (JP) .................................. 2002-204797
Oct. 18, 2002 (JP) .................................. 2002-304672
Jun. 17, 2003 (JP) .................................. 2003-172518

(51) Int. Cl.
*G03C 1/02* (2006.01)
(52) U.S. Cl.
USPC .................. 430/1; 430/2; 359/3; 156/233

(58) Field of Classification Search .................. None
See application file for complete search history.

(56) References Cited

U.S. PATENT DOCUMENTS

| 4,970,129 A | * | 11/1990 | Ingwall et al. .................. 430/1 |
| 5,187,770 A | | 2/1993 | Mishima et al. |
| 5,208,312 A | | 5/1993 | Boutevin et al. |

(Continued)

FOREIGN PATENT DOCUMENTS

| EP | 1022625 | * 7/2000 |
| EP | 1 231 511 A2 | 8/2002 |

(Continued)

OTHER PUBLICATIONS

USPTO OA mailed Sep. 7, 2005 for Parent U.S. Appl. No. 10/615,041.

(Continued)

*Primary Examiner* — Martin Angebranndt
(74) *Attorney, Agent, or Firm* — Ladas & Parry LLP

(57) ABSTRACT

The volume hologram recording photosensitive composition provided by the present invention contains at least a fluorine-contained photoreactive compound represented by the following formula (1): $R^1-R^3-(CF_2)n-R^4-R^2$ wherein $R^1$ and $R^2$ are photoreactive groups which can be bonded to each other by photoreaction, and each of $R^3$ and $R^4$ is independently a single bond or a bivalent hydrocarbon group having 1 to 5 carbon atoms, and n is an integer of 1 or more. This volume hologram recording photosensitive composition is used to form a recording section of a recording medium, and then the section is exposed to light, whereby a bright volume hologram can be obtained.

14 Claims, 2 Drawing Sheets

U.S. PATENT DOCUMENTS

| | | | |
|---|---|---|---|
| 5,453,340 A | | 9/1995 | Kawabata et al. |
| 5,702,846 A | * | 12/1997 | Sato et al. ............... 430/2 |
| 5,759,721 A | | 6/1998 | Dhal et al. |
| 5,858,614 A | * | 1/1999 | Sato et al. ............ 430/280.1 |
| 5,869,210 A | | 2/1999 | Ohkuma et al. |
| 6,066,378 A | | 5/2000 | Morii et al. |
| 7,132,200 B1 | * | 11/2006 | Ueda et al. ............... 430/1 |
| 7,323,275 B2 | | 1/2008 | Otaki et al. |
| 7,521,155 B2 | * | 4/2009 | Otaki et al. ............... 430/1 |
| 7,550,234 B2 | * | 6/2009 | Otaki et al. ............... 430/1 |
| 7,629,086 B2 | | 12/2009 | Otaki et al. |
| 7,824,822 B2 | * | 11/2010 | Otaki et al. ............... 430/1 |
| 2002/0110740 A1 | | 8/2002 | Otaki et al. |
| 2003/0087163 A1 | | 5/2003 | Otaki et al. |

FOREIGN PATENT DOCUMENTS

| | | |
|---|---|---|
| JP | 3-123715 A | 5/1991 |
| JP | 3-130211 A | 6/1991 |
| JP | 4-116584 A | 4/1992 |
| JP | 4-188141 A | 7/1992 |
| JP | 5-107999 A | 4/1993 |
| JP | 5-210343 A | 8/1993 |
| JP | 5-210344 A | 8/1993 |
| JP | 5-257416 A | 10/1993 |
| JP | 5-273899 A | 10/1993 |
| JP | 6-019040 A | 1/1994 |
| JP | 6-067588 A | 3/1994 |
| JP | 6-130879 A | 5/1994 |
| JP | 6-175554 A | 6/1994 |
| JP | 8-016077 A | 1/1996 |
| JP | 8-201786 A | 8/1996 |
| JP | 10-204137 A | 8/1998 |
| JP | 11-095431 A | 4/1999 |
| JP | 2000-154351 A | 6/2000 |
| JP | 2000-508783 | 7/2000 |
| JP | 2002-236440 A | 8/2002 |
| JP | 2002-323845 A | 11/2002 |
| JP | 2003-089780 A | 3/2003 |
| WO | 97/38333 A1 | 10/1997 |

OTHER PUBLICATIONS

USPTO OA mailed Aug. 20, 2008 for Parent U.S. Appl. No. 10/615,041.

USPTO OA mailed Mar. 4, 2009 for Parent U.S. Appl. No. 10/615,041.

USPTO OA mailed Nov. 25, 2009 for Parent U.S. Appl. No. 10/615,041.

USPTO NOA mailed Jul. 6, 2010 for Parent U.S. Appl. No. 10/615,041.

* cited by examiner

PHOTOSENSITIVE COMPOSITION FOR VOLUME HOLOGRAM RECORDING, PHOTOSENSITIVE MEDIUM FOR VOLUME HOLOGRAM RECORDING AND VOLUME HOLOGRAM

CROSS-REFERENCE TO RELATED APPLICATIONS

This application is a continuation application of U.S. Ser. No. 10/615,041 filed on Jul. 8, 2003, which has been granted as U.S. Pat. No. 7,824,822.

BACKGROUND OF THE INVENTION

1. Field of the Invention

The present invention relates to a new photosensitive composition capable of recording a volume hologram, a volume hologram recording medium using the same, and a volume hologram produced using the photosensitive composition.

2. Description of the Related Art

A volume hologram is produced by allowing object lights (object waves) and reference lights (reference waves) each having high coherency (interfering ability) and an equal wavelength to interfere with each other, radiating the resultant lights into a layer made of volume hologram recording material, and recording three-dimensional information about the object, as interference fringes, inside the recording material layer. The interference fringes can be recorded, for example, as a variation in the refractive index (a change in the refractive index) corresponding to bright or dark regions of interference light, inside the recording material layer. Volume holograms are widely used in fields, for example, for design purpose, security purpose, optical element purpose and others since the volume holograms make it possible to represent an object three-dimensionally, have high diffraction efficiency and wave selectivity, and need high-level producing technique.

As photosensitive compositions for producing volume holograms, an OmniDex series available from Du Pont is only one present in the market under mass-production. This material is a dry-developable type photopolymer material which uses a radical polymerizable monomer, a binder resin, a photo-radical polymerization initiator and a sensitizing dye as its major components and make use of a difference in refractive index between the radical polymerizable monomer and the binder resin. That is, when the photosensitive composition formed into a film is subjected to hologram-exposure (exposure for recording holograms), radical polymerization is initiated in regions where the light is intense and a gradient of the concentration of the radical polymerizable monomer is generated accordingly. Thus, the radical polymerizable monomer molecules diffuse and move from regions where the light is weak to the regions where the light is intense. As a result, the radical polymerizable monomers can be made dense or thin dependently on the intensity or weakness of the interfere light, so that a refractive index difference is generated. This material system has the best performance among volume holograms photopolymers which have been reported up to the present time. However, it has been pointed out that the system has problems about heat resistance and transparency. As described above, usually, a hologram-exposure is performed by allowing object waves and reference waves to interfere with each other and be radiated into regions where images are to be recorded. However, it is also possible to perform a hologram-exposure by using of light having no coherency.

A material system using radical polymerization and cationic polymerization together is reported. For example, Japanese Patent No. 2873126 discloses a system using a monomer having a diarylfluorene skeleton as a high refractive index radical polymerizable monomer and a cationic polymerizable monomer which has a lower refractive index than the radical polymerizable monomer. In this system, the high refractive index components are polymerized by radical polymerization at the time of hologram-exposure, and subsequently the images are fixed by cationic polymerization at time of fixation-exposure.

A material system using cationic polymerization is also disclosed in, for example, U.S. Pat. No. 5,759,721. This material system has an advantage of being free from such oxygen inhibition as seen in a radical polymerization system. However, this system has problems that it has low photosensitivity (photospeed) to cationic polymerization and it is difficult to provide this system with sensitivity in a long-wavelength range.

Moreover, Japanese Patent No. 2953200 discloses a material system using a combination of an inorganic material network and a photopolymerizable monomer. When an inorganic material capable of forming the network is used as a binder, there are produced advantages that this material system is superior in heat resistance, environmental resistance and mechanical strength and further the refractive index difference between the photopolymerizable organic monomer and the inorganic material can be made larger. But there are caused problems that the hologram recording film prepared from this material system is somewhat brittle and inferior in properties of flexibility, processability and coating ability and that it is difficult to prepare a homogenous coating material since the compatibility between the inorganic binder and the organic monomer is not good.

Japanese Patent Application National Publication No. 2000-508783 discloses, as a hologram recording material, a material in which metal superfine particles are dispersed in a solid matrix. However, in this material, it is required to provide the matrix with fluidity so that there is a problem of poor solidity.

In particular, known examples of a combination use of a high refractive index binder resin containing an aromatic ring and a low refractive index fluorine-contained monomer include Japanese Patent Application Laid-Open (JP-A) No. 5-210343, 5-210344 and 5-257416. According to this combination, however, the sensitivity at the time of hologram-exposure is not so high since the polymerization reactivity is insufficient. In order to promote the polymerizability of the fluorine-contained monomer, it is stated that a polyfunctional acrylate is added thereto. However, this method obstructs the low refractivity which the fluorine-contained monomer originally has.

A known example of a combination use of a low refractive index binder resin, composed of a fluorine-contained acrylic monomer and a nonfluorine-contained acrylic monomer, and a high refractive index monomer in which an aromatic ring is contained include JP-A No. 6-67588. However, this example also has problems that the low refractivity of the fluorine-contained acrylic monomer is obstruct by copolymerization thereof with the nonfluorine-contained acrylic monomer and further yellowing is liable to be caused by the aromatic ring of the aromatic ring-contained monomer.

Since fluorine-contained compounds generally have a very low refractive index, they are expected as materials for making a refractive index modulation ($\Delta n$) large. However, the compounds are poor in compatibility with other blend components such as a binder resin. Thus, the range from which other blend components can be selected is limited and further it is difficult to make the blend ratio of the fluorine-contained compound high. For this reason, in material systems in which a fluorine-contained compound is blended as a refractive index modulating component, the Δn thereof has been hitherto unable to be sufficiently improved. Thus, it has been desired to improve the Δn when such a material is applied to new optical elements.

SUMMARY OF THE INVENTION

In light of the above-mentioned situation, the present invention has been achieved. An object of the present invention is to provide a volume hologram recording material, a volume hologram recording medium, and a volume hologram which have a larger refractive index modulation (Δn) than those in the prior art.

In order to attain the above-mentioned object, the volume hologram recording photosensitive composition provided by the present invention is characterized in that it comprises a fluorine-contained photoreactive compound represented by the following formula (1):

$$R^1-R^3-(CF_2)n-R^4-R^2 \quad \text{Formula (1)}$$

wherein $R^1$ and $R^2$ are photoreactive groups which can be bonded to each other by photoreaction, and each of $R^3$ and $R^4$ is independently a single bond or a bivalent hydrocarbon group having 1 to 5 carbon atoms, and n is an integer of 1 or more.

The volume hologram recording photosensitive medium provided by the present invention is characterized in that it has a hologram recording section made of the above-mentioned volume hologram recording photosensitive composition.

The volume hologram provided by the present invention is characterized in that it has a hologram layer which is formed by exposing, to light, a hologram recording section made of the above-mentioned volume hologram recording photosensitive composition, the refractive index modulation (Δn) between its low refractive index region and its high refractive index region being 0.016 or more.

The volume hologram recording photosensitive composition according to the present invention comprises the fluorine-contained photoreactive compound represented by the formula (1) as a refractive index modulating component. This fluorine-contained photoreactive compound has fluorine atoms in the molecular structure thereof; therefore, the compound generally has a very small refractive index and is suitable for a low refractive index type refractive index modulating component.

Since this fluorine-contained photoreactive compound has a very high compatibility with other blend components such as a binder, ranges from which other blend components can be selected extend very wide. Accordingly, binder resins, monomers and oligomers which take a large refractive index modulation can be selected from wide ranges. Thus, the blend ratio of the fluorine-contained photoreactive compound in the volume hologram recording photosensitive composition can be made high without damaging the transparency of the composition.

Since this fluorine-contained photoreactive compound has two photopolymerizable groups in the single molecule, it has a large polymerization reactivity at the time of hologram-exposure.

Consequently, use of the fluorine-contained photoreactive compound represented by the formula (1) provides a volume hologram recording photosensitive composition, a volume hologram recording medium and a volume hologram which are superior in hologram recording performances such as a refractive index modulation and sensitivity.

The photoreactive groups $R^1$ and $R^2$ contained in the fluorine-contained photoreactive compound represented by the formula (1) preferably have any one photoreactivity selected from the group consisting of the radical photopolymerization, cationic photopolymerization, anionic photopolymerization and polymerization advancing via photodimerization. It is particularly preferable that the photoreactive groups $R^1$ and $R^2$ are an acryloyl group or a methacryloyl group independently to each or an epoxy group or an oxetanyl group independently to each.

Among the fluorine-contained photoreactive compounds represented by the formula (1), preferred are compounds wherein each of $R^1$ and $R^2$ is an epoxy group and a compound wherein each of $R^1$ and $R^2$ is an oxetanyl group represented by the following formula (2):

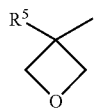

Formula (2)

wherein $R^5$ is a hydrogen atom or an alkyl group having 1 to 10 carbon atoms.

It is also preferable that $R^3$ and $R^4$ are a single bond or a linear hydrocarbon group having 1 to 5 carbon atoms independently to each other.

The fluorine-contained photoreactive compound represented by the formula (1) exhibit superior compatibility with various binder resins. As the binder resin, it is preferable to use at least one selected from the group consisting of a thermoplastic resin, a thermosetting resin, an organic-inorganic hybrid polymer, and an organic metal compound represented by the formula (4):

$$M'(OR'')n' \quad \text{Formula (4)}$$

wherein M' represents a metal such as Ti, Zr, Zn, In, Sn, Al or Se, and R'' represents an alkyl group having 1 to 10 carbon atoms, and n' is the valence number of the metal M'.

The volume hologram recording photosensitive composition according to the present invention can comprise a second refractive index modulating component other than the fluorine-contained photoreactive compound represented by the formula (1). When the fluorine-contained photoreactive compound represented by the formula (1) is used in combination with the second refractive index modulating component, the refractive index modulation Δn at the time of hologram-exposure can be made larger by the so-called volume exclusion effect.

Also, by adding metal fine particles having a refractive index different from that of the fluorine-contained photoreactive compound represented by the formula (1) to the volume hologram recording photosensitive composition, the volume exclusion effect can be obtained in the same manner as in the case of the addition of the second refractive index modulating component. Consequently, the refractive index modulation Δn can be made large.

When a sensitizing dye is used, particularly high transparency can be obtained by adding a sensitizing dye which is made transparent by heating or irradiation with ultraviolet rays, thus being preferable.

DETAILED DESCRIPTION OF THE PREFERRED EMBODIMENT

Figure 1:
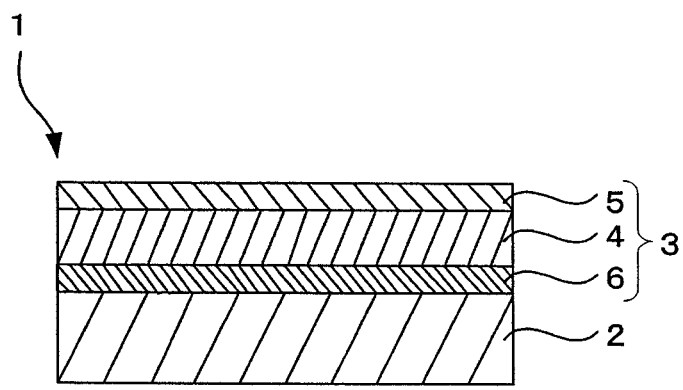
FIG. 1 is a schematic sectional view illustrating one example of a hologram transfer foil according to the present invention.

The present invention is described in detail hereinafter. In the specification, the word "meth(acrylate)" represents acrylate and methacrylate, the word "meth(acryl)" represents acryl and methacryl, and the word "meth(acryloyl)" represents acryloyl and methacryloyl.

The volume hologram recording photosensitive composition provided according to the present invention contains at least a fluorine-contained photoreactive compound represented by the following formula (1):

$$R^1-R^3-(CF_2)n-R^4-R^2 \quad \text{Formula (1)}$$

wherein $R^1$ and $R^2$ are photoreactive groups which can be bonded to each other by photoreaction, and each of $R^3$ and $R^4$ is independently a single bond or a bivalent hydrocarbon group having 1 to 5 carbon atoms, and n is an integer of 1 or more.

The value Δn calculated on the basis of Kogelnik's theory is a value representing a refractive index modulation in a refractive index distribution formed in accordance with interference light (that is, light in which interference fringes are generated) incident on a photosensitive material. As this value Δn is larger, a better hologram, which is visually brighter, can be obtained.

The volume hologram recording photosensitive composition according to the present invention contains, as a component for generating this refractive index modulation Δn (a refractive index modulating component), a bifunctional fluorine-contained photoreactive compound having a structure represented by the formula (1). This fluorine-contained photoreactive compound has fluorine atoms in the molecular structure thereof, and therefore, generally has a very small refractive index, thus being suitable for a refractive index modulating component of a low refractive index type. The fluorine-contained photoreactive compound contained in a volume hologram recording material layer formed by using the volume hologram recording photosensitive composition of the present invention diffuse and move at the time of hologram-exposure, thereby being unevenly present at a high concentration at intensely-exposed regions or weakly-exposed regions. Then the molecules are fixed by polymerization reaction, so that the refractive index of the regions where the fluorine-contained photoreactive compounds are unevenly present is remarkably lowered.

Since the fluorine-contained photoreactive compound having the structure represented by the general formula (1) has a very high compatibility with other blend components such as a binder resin, ranges from which other blend components can be selected extend wide. Accordingly, the binder resins, monomers and oligomers which take a large refractive index modulation can be selected from wide ranges. Thus, the blend ratio of the fluorine-contained photoreactive compound in the volume hologram recording photosensitive composition can be made high without damaging the transparency of the composition.

Since this fluorine-contained photoreactive compound has two photopolymerizable groups in the single molecule thereof, the polymerization reactivity thereof is large at the time of hologram-exposure. This fluorine-contained photoreactive compound has a large polymerization reactivity, and it is unnecessary to add a large amount of a polyfunctional acrylate or the like for raising the polymerizability of a fluorine-contained monomer as performed in the prior art. Therefore, low refractivity, which is a characteristic of the fluorine-contained photoreactive compound, is not obstructed.

Consequently, this fluorine-contained photoreactive compound is superior in compatibility and polymerization reactivity, and by incorporating this compound, as a refractive index modulating component, into a volume hologram recording photosensitive composition, superior sensitivity and refractive index modulating effect can be obtained.

In the formula (1), $R^1$ and $R^2$ may be the same or different if they are photoreactive groups (atoms or atomic groups which have photoreactivity) which can be bonded to each other by irradiation with light. Examples of the photoreactive group include groups Which advance reaction with a reaction style of polymerization such as radical photopolymerization, cationic photopolymerization or anionic photopolymerization, or polymerization advancing via photodimerization or the like.

Examples of the radical photopolymerizable group include functional groups having an ethylenically unsaturated bond (preferably, an ethylenic double bond). Specific examples thereof include acryloyl, methacryloyl, vinyl, vinylcycloalkyl, and allyl groups or the like. Among these groups, acryloyl and methacryloyl groups are preferable from the viewpoint of reactivity.

Examples of the cationic photopolymerizable group include cyclic ether groups such as epoxy and oxetanyl groups; thioether groups; and vinyl ether groups. Among these groups, cyclic ether groups such as epoxy and oxetanyl groups are preferred since the shrinkage of cured product, following the polymerization reaction thereof, is small. Compounds having an epoxy group among cyclic ether groups have an advantage that compounds having various structures are easily available. An oxetanyl group among cyclic ether groups has advantages that it has a higher polymerization degree and a lower toxicity than an epoxy group.

An example of the fluorine-contained photoreactive compound wherein $R^1$ and $R^2$ in the formula (1) are epoxy groups is a compound represented by the following formula (1a):

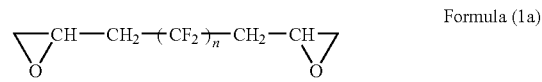

Formula (1a)

wherein n is preferably an integer of 4 to 20.

As the fluorine-contained photoreactive compound wherein $R^1$ and $R^2$ in the formula (1) are oxetanyl groups, there is preferably used a compound wherein each of $R^1$ and $R^2$ has an oxetanyl group represented by the following formula (2):

Formula (2)

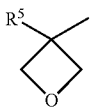

wherein $R^5$ is a hydrogen atom or an alkyl group having 1 to 10 carbon atoms.

More specifically, there can be used a compound represented by the following formula (1b):

Formula (1b)

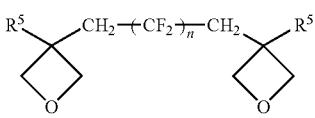

wherein $R^5$ is the same as described above, and n is preferably from 4 to 20.

Examples of the anionic photopolymerization-reactive group include a vinyl group having an electron withdrawing group, cyclic ether groups, such as epoxy and oxetanyl groups, which are also the above-mentioned cationic photopolymerizable groups, cyclic urethane groups, cyclic ureas, and cyclic siloxane groups.

An example of the polymerization-reactive group based on photodimerization requiring no initiator is a vinyl cinnamate group. It is also possible to use a relationship between a donating group and an accepting group whose reaction advances at a ratio of 1:1. An example of the donating group is a maleimide group, and an example of the accepting group is a vinyl ether group. In this case, it is advisable that a compound wherein $R^1$ and $R^2$ are donating groups and a compound wherein $R^1$ and $R^2$ are accepting groups are mixed at a ratio of 1:1, and the mixture is used.

Specific examples of the combination of $R^1$ and $R^2$ which can be bonded to each other and are different from each other include a combination of an acryloyl group and a methacryloyl group, and a combination of an epoxy group and an oxetanyl group.

$R^3$ and $R^4$ are a single bond or a bivalent hydrocarbon group having 1 to 5 carbon atoms independently to each other. It should be noted that a case in which repeating units of a methylene fluoride group ($CF_2$) are bonded directly (that is, bonded through single bonds) to $R^1$ and $R^2$ is also included in the definition of $R^3$ and $R^4$. $R^3$ and $R^4$ which are hydrocarbon groups may be linear hydrocarbon groups or hydrocarbon groups having a side chain. $R^3$ and $R^4$ are preferably linear hydrocarbon groups or single bonds. Specific examples of the hydrocarbon group include methylene, ethylene, trimethylene, tetramethylene and propylene or the like. Methylene is preferable in order to make the refractive index as low as possible.

The number n of the repeating units of the methylene fluoride group ($CF_2$) is preferably from 1 to 30 from the viewpoint of diffusing/moving ability, and is more preferably from 4 to 20, most preferably from 4 to 10 from the viewpoint of volatilization and safety as well as the diffusing/moving ability.

The method for synthesizing the fluorine-contained photoreactive compound represented by the formula (1) may be, for example, a method of deriving this compound from fluorinated diiodo alkane. In a case where each of $R^1$ and $R^2$ is an epoxy group and n is 4, if the known method, for example a synthesis method according to a method described in, for example, Japanese Patent Application Publication (JP-B) No. 54-11284, JP-B 59-22712 or JP-B 6-60116, or J. Fluorine Chem., 73, 151 (1995) or the like is performed by using octafluoro-1,4-diiodobutane (trade name: I-8407, manufactured by Daikin Industries, Ltd.) as the starting material, the fluorine-contained photoreactive compound can be synthesized via a diol derivative from the starting material.

In a case where each of $R^1$ and $R^2$ is an oxetanyl group, if the above-mentioned dial derivative is converted to an alkali metal alcoholate and further the alcoholate is reacted with a sulfonate of a 3-hydroxymethyloxetanes, referring to a known method, for example, a method described in JP-A No. 2000-336082, the fluorine-contained photoreactive compound can be synthesized.

The volume hologram recording photosensitive composition according to the present invention may be incorporate with the other components such as a photopolymerization initiator, a binder resin, a sensitizing dye, a refractive index modulating component other than the fluorine-contained photoreactive compound (i.e., a second refractive index modulating component) or the like together with the fluorine-contained photoreactive compound having a chemical structure of the formula (1) described above, as required.

It is preferable to incorporate, into the volume hologram recording photosensitive composition according to the present invention, a photopolymerization initiator for initiating or promoting polymerization or dimerization reaction of the fluorine-contained photoreactive compound by hologram-exposure. The photopolymerization initiator is appropriately selected from a radical photopolymerization initiator, a cationic photopolymerization initiator, an anionic photopolymerization initiator, and other initiators in accordance with the style of the photoreaction, and then used.

Examples of the radical photopolymerization initiator include imidazole derivatives, bisimidazole derivatives, N-arylglycine derivatives, organic azide compounds, titanocenes, aluminate complexes, organic peroxides, N-alkoxypyridinium salts, and thioxanthone derivatives. Specific examples thereof include 1,3-di(tert-butyldioxycarbonyl)benzophenone, 3,3',4,4'-tetrakis(tert-butyldioxycarbonyl)benzophenone, 3-phenyl-5-isooxazolone, 2-mercaptobenzimidazole, bis(2,4,5-triphenylimidazole). 2,2-dimethoxy-1,2-diphenylethane-1-one (trade name: Irgacure 651, manufactured by Ciba Specialty Chemicals, inc.), 1-hydroxy-cyclohexyl-phenyl-ketone (trade name: Irgacure 184, manufactured by Ciba Specialty Chemicals, inc.), 2-benzyl-2-dimethylamino-1-(4-morpholinophenyl)-butane-1-one (trade name: Irgacure 369, manufactured by Ciba Specialty Chemicals, inc.), and bis($\eta^5$-2,4-cyclopentadiene-1-yl)-bis(2,6-difluoro-3-(1H-pyrrole-1-yl)-phenyl)titanium) (trade name: Irgacure 784, manufactured by Ciba Specialty Chemicals, inc). However, it is not limited to these examples.

Examples of the cationic photopolymerization initiator include sulfonates, imidesulfonate, dialkyl-4-hydroxysulfonium salts, p-nitrobenzylarylsulfonate, silanol-aluminum complexes, and ($\eta^6$-benzene) ($\eta^5$-cyclopentadienyl)iron (II). Specific examples thereof include benzoin tosylate, 2,5-dinitrobenzyl tosylate, and N-tosylphthalicimide. However, it is not limited to these examples.

Examples of a compound which can be used as either of the radical photopolymerization initiator or the cationic photopolymerization initiator include aromatic iodonium salts, aromatic sulfonium salts, aromatic diazonium salts, aromatic phosphonium salts, triazine compounds, and iron arene complexes. Specific examples thereof include: iodonium salts of chloride, bromide, borofluoride, hexafluorophosphate, hexafluoroantimonate or the like of iodoniums such as diphenyliodonium, ditolyliodonium, bis(p-tert-butylphenyl)iodonium and bis(p-chlorophenyl)iodonium, sulfonium salts of chloride, bromide, borofluoride, hexafluorophosphate, fluoroantimonate or the like of sulfonates such as triphenylsulfonium, 4-tert-butyltriphenylsulfonium and tris(4-methylphenyl)sulfonium, and 2,4,6-substituted-1,3,5-triazine compounds such as 2,4,6-tris(trichloromethyl)-1,3,5-triazine, 2-phenyl-4,6-bis(trichloromethyl)-1,3,5-triazine and 2-methyl-4,6-bis(trichloromethyl)-1,3,5-triazineorthe like. However, it is not limited to these examples.

Examples of the anionic photopolymerization initiator include compounds which generate amine by irradiation with, for instance, ultraviolet rays. Specific examples thereof include 1,10-diaminodecane, 4,4'-trimethylenedipiperidine, carbomates and derivatives thereof, cobalt-amine complexes, aminooxyiminos, and ammonium borates or the like. Example of a product commercially available is NBC-101 manufactured by Midori Kagaku Co., Ltd.

The photopolymerization initiator is preferably subjected to decomposition treatment after hologram recording from a viewpoint of a stabilization of the recorded hologram. For example, the initiator of an organic peroxide type is easily decomposed by irradiation with ultraviolet rays, thus being preferable.

By incorporating a binder resin into the volume hologram recording photosensitive composition according to the present invention, a non-fluid volume hologram recording layer can be formed on a substrate, and it is accordingly used as a dry-developable hologram forming material.

The fluorine-contained photoreactive compound having the structure represented by the formula (1) makes it possible to produce a hologram by itself without other components such as the binder resin being incorporated. In this case, however, the fluidity of this compound is too high, and it is therefore necessary that a proper method, for example a method to put the fluorine-contained photoreactive compound air-tightly between transparent substrates such as glass is applied to form a photosensitive composition layer consisting of only said compound or consisting essentially of said compound, and then a hologram-exposure is carried out.

The fluorine-contained photoreactive compound represented by the formula (1) exhibits superior compatibility with various binder resins. For example, ordinary thermoplastic resins, oligomer type setting resins, organic-inorganic hybrid resins, and so on can be used. The fluorine-contained photoreactive compound is a low refractive index type refractive indexmodulating component, and therefore, in order to make the refractive index modulation (Δn) after hologram-exposure large, it is preferred to use a binder resin having a large refractive index. The binder resin may have polymerization reactivity or have no polymerization reactivity. In a case where the binder resin has polymerization reactivity, a volume hologram recording photosensitive medium or a volume hologram using the volume hologram recording photosensitive composition according to the present invention is improved in the membrane physical properties (physical properties of a coating layer) such as strength and heat resistance or the like, whereby being preferable.

As the binder resin, a thermoplastic resin can be used. Specifically, there may be used poly(meth)acrylate or partially-hydrolyzed products thereof, polyvinyl acetate or hydrolyzed products thereof, polyvinyl alcohol or partially-acetalized products thereof, triacetylcellulose, polyisoprene, polybutadiene, polychloroprene, silicone rubber, polystyrene, polyvinyl butyral, polyvinyl chloride, polyarylate, chlorinated polyethylene, chlorinated polypropylene, poly-N-vinylcarbazole or derivatives thereof, poly-N-vinylpyrrolidone or its derivatives, copolymer of styrene and maleic anhydride or semi-esterifiedproducts thereof, copolymers which contain, as a component to be copolymerized, at least one selected from copolymerizable monomers such as acrylic acid, acrylic esters, acrylamide, acrylonitrile, ethylene, propylene, vinyl chloride, vinyl acetate or the like, or mixture thereof.

As the binder resin, it is also possible to use an oligomer type setting resin. Examples thereof include epoxy compounds produced by condensation reaction of any one of various phenolic compounds such as bisphenol A, bisphenol S, Novolak, o-cresol Novolak, p-alkylphenol Novolak or the like and epichlorohydrin.

As the binder resin, an organic-inorganic hybrid resin using sol-gel reaction can also be used. The organic-inorganic hybrid resin using sol-gel reaction is any resin which can be condensation-polymerized by sol-gel reaction or has already been condensation-polymerized by sol-gel reaction, and which is capable of providing, after being subjected to the sol-gel reaction, a polymer structure in which organic structure moieties and inorganic structure moieties are coincidentally present.

An example of the organic-inorganic hybrid resin is an organic-inorganic hybrid polymer, such as a copolymer of a vinyl monomer and an organic metal compound having a polymerizable group represented by the following formula (3):

$$R_m M(OR')_n \qquad \text{Formula (3)}$$

wherein M represents a metal such as Si, Ti, Zr, Zn, In, Sn, Al or Se, R represents a vinyl group having 1 to 10 carbon atoms, or a (meth)acryloyl group, R' represents an alkyl group having 1 to 10 carbon atoms, and m+n is the valence number of the metal M.

Examples of the compound wherein the metal atom M is Si include vinyltriethoxysilane, vinylmethoxysilane, vinyltributoxysilane, vinyltriallyloxysilane, vinyltetraethoxysilane, vinyltetramethoxysilane, and (meth)acryloxypropyltrimethoxysilane and so on.

Examples of the vinylmonomer used in the organic-inorganic hybrid polymer include (meth)acrylic acid and (meth)acrylates. However, they are not limited to these examples.

Among the organic-inorganic hybrid resins, an organic metal compound represented by a formula (4) described below is particularly effective for making the refractive index difference between the binder resin and the fluorine-contained photoreactive compound larger since the organic metal compound has a smaller molecular weight and a large effect of raising the crosslink density in comparison with the above-mentioned organic-inorganic hybrid polymer which has already been polymerized:

$$M'(OR'')_{n'} \qquad \text{Formula (4)}$$

wherein M' represents a metal such as Ti, Zr, Zn, In, Sn, Al or Se, R'' represents an alkyl group having 1 to 10 carbon atoms, and n' is the valence number of the metal M.

When the organic metal compound represented by the formula (4) is added to the volume hologram recording photosensitive composition, the compound associates with the above-mentioned binder resin to form a network structure through sol-gel reaction in the presence of water and an acid catalyst, whereby providing effects of improving toughness or heat resistance of the resultant layer as well as raising of the refractive index of the binder. In order to raise the refractive index difference between the binder resin and the fluorine-contained photoreactive compound, it is preferable to use, as the metal M', one having a refractive index being as high as possible.

It is more preferable to use, as the binder resin, a binder resin which can form a covalent bond with the photoreactive group of the fluorine-contained photoreactive compound. In this case, if unreacted molecules of the fluorine-contained photoreactive compound or polymer molecules of the fluorine-contained photoreactive compound after hologram-exposure are covalent-bonded to the binder resin molecules in a given reaction style, a stable bond between the fluorine-contained photoreactive compound and the binder resin can be generated, thereby obtaining a hologram layer superior in layer strength, heat resistance, hologram-fixing property and so on.

It is preferable to introduce a functional group which is photoreactive with or thermally-polymerizable with the photoreactive group of the fluorine-contained photoreactive compound, as a functional group capable of forming the above-mentioned covalent bond, into the binder resin. Any hologram recording material layer of a photopolymer type is frequently subjected to exposuring or heating homogenous over the entire surface thereof in order to promote the variation in the refractive index or complete the polymerization reaction after the process of hologram-exposure. In a case where the functional group of the binder resin is photopolymerizable or thermally polymerizable with the photopolymerizable group of the fluorine-contained photoreactive compound, the following two processes can be unified to one process in a common reaction style: the process of exposing or heating the whole surface of a layer made of the hologram recording photosensitive composition (hereinafter referred to as "a hologram recording material layer") in order to promote the variation in the refractive index or fix a hologram after hologram-exposure and the process of copolymerizing the binder resin with the fluorine-contained photoreactive compound or a polymer thereof in order to improve the membrane strength or the endurance of the hologram recording material layer, thus being preferable.

It is particularly preferable to introduce a functional group photopolymerizable with the photoreactive group of the fluorine-contained photoreactive compound into the binder resin. For example, when the fluorine-contained photoreactive compound has, as its photoreactive group, an ethylenically unsaturated group capable of causing addition polymerization reaction, a binder resin having a similar ethylenically unsaturated bond (preferably, an ethylenic double bond) capable of causing additional polymerization, such as an acryloyl group or a methacryloyl group is used. When the fluorine-contained photoreactive compound has a cationic photopolymerizable group such as an epoxy group, a binder resin having a functional group polymerizable with the cationic photopolymerizable group at the time of hologram-exposure is used. Examples of the functional group polymerizable with the cationic photopolymerizable group at the time of hologram-exposure include functional groups such as hydroxyl and carboxylic groups as well as cationic photopolymerizable groups themselves, such as epoxy and vinyl ether groups.

In a case where the above-mentioned particularly preferable combination is adopted and when the hologram recording material layer is subjected to hologram-exposure, the fluorine-contained photoreactive compounds in intensely exposed regions are polymerized not only with other fluorine-contained photoreactive compounds being adjacent but also with the surrounding the binder resin, and reactivity accordingly becomes high, thereby providing effect of improving the sensitivity at the time of the hologram-exposure and the refractive index modulation. Also in this case, if ordinary exposuring or heating homogenous over the entire surface is carried out after the hologram-exposure, the variation in the refractive index is promoted and the polymerization reaction is completed to form a hologram, and further the formation of the covalent bond between the binder resin and the fluorine-contained photoreactive compound is further advanced so as to provide an advantageous effect that superior layer physical properties such as layer strength and heat resistance is give to the hologram recording material layer.

As the binder resin, only one may be selected from the materials exemplified above to be used, or two or more may be mixed to be used.

When the hologram recording material comprising two or more refractive index modulating components having different refractive indexes and photopolymerization rates is subjected to hologram-exposure, polymerization reaction of the refractive index modulating component having a higher polymerization rate advances preferentially in intensely exposed regions so that the concentration of the high polymerization rate refractive index modulating component rises. At the same time, the low polymerization rate refractive index modulating component is driven out from the intensely exposed regions to be diffused and moved to weakly-exposed regions and polymerized and fixed therein. As a result, a refractive index difference between the intensely exposed regions and the weakly-exposed regions is generated on the basis of the respective refractive indexes of the different kinds of refractive index modulating components. This is volume exclusion effect.

In order to make the refractive index modulation $\Delta n$ large by such volume exclusion effect, it is allowable to incorporate, into the volume hologram recording photosensitive material of the present invention, a second refractive index modulating component having a refractive index different from that of the fluorine-contained photoreactive compound represented by the formula (1) and having a polymerization rate different from that of the fluorine-contained photoreactive compound.

The fluorine-contained photoreactive compound represented by the formula (1) is a low refractive index type refractive index modulating component and the second refractive index modulating component is a high refractive index type refractive index modulating component in usual. Therefore, when the polymerization rate of the fluorine-contained photoreactive compound represented by the formula (1) is larger than that of the second refractive index modulating component, the fluorine-contained photoreactive compounds diffuse and move to the intensely exposed regions to concentrate and cause lowering of the refractive index in usual, while the second refractive index modulating components are driven out from the intensely exposed regions to be diffused and moved to the weakly-exposed regions to concentrate and cause rising of the refractive index in usual. On the other hand, when the polymerization rate of the fluorine-contained photoreactive compound represented by the formula (1) is lower than that of the second refractive index modulating component, the converse to the above-mentioned case is caused. That is, a refractive index usually becomes high in the intensely exposed regions by rising concentration of the second refractive index modulating component, and a refractive index usually becomes low in the weakly-exposed regions by rising concentration of fluorine-contained photoreactive compound.

As the second refractive index modulating component, there can be used a compound which can undergo the advance of polymerization or dimerization by irradiation with light and can diffuse and move in the volume hologram recording material layer (provided that the fluorine-contained photoreactive compound represented by the formula (1) is excluded). Examples thereof include compounds which can undergo the advance of polymerization in a reaction style such as radical photopolymerization, cationic photopolymerization, anionic photopolymerization, or polymerization via photodimerization. About the second refractive index modulating component, differences of the refractive index and the polymerization rate thereof from those of the fluorine-contained photoreactive compound represented by the formula (1) are preferably made as large as possible.

The second refractive index modulating component is a component for enlarging the refractive index modulation $\Delta n$ generated by the refractive index difference between the fluorine-contained photoreactive compound represented by the formula (1) and the binder resin. For this reason, as the second refractive index modulating component, selected is a component satisfying a largeness and smallness relationship having the same tendency as the largeness and smallness relationship between the refractive index of the fluorine-contained photoreactive compound and that of the binder resin. In other words, the fluorine-contained photoreactive compound is generally a low refractive index type refractive index modulating component, and therefore, a binder resin having a high refractive index is usually combined with the fluorine-contained photoreactive compound, and further as the second refractive index modulating component, there is used a high refractive index type refractive index modulating component (that is, a refractive index modulating component which is unevenly located and polymerized in the intensely exposed regions or weakly-exposed regions so as to make the refractive index of the regions high) like the binder resin.

If the second refractive index modulating component has a polymerization rate different from that of the fluorine-contained photoreactive compound represented by the formula (1), the reaction styles of the two may be the same, for example, as when the two are radical photopolymerizable, or may be different, for example, as when one thereof is radical photopolymerizable and the other is cationic photopolymerizable.

As the second refractive index modulating component, an oligomer or a polymer containing a photoreactive group may be used. It is however preferable to use a monomer containing a photoreactive and bondable group since the refractive index modulating component diffuse and move more easily in the hologram recording material layer at the time of hologram-exposure as the molecular weight thereof is smaller.

The radical photopolymerizable compound out of the second refractive index modulating component may be a compound having at least one ethylenically unsaturated bond capable of being addition-polymerized. Examples thereof include unsaturated carboxylic acid and salts thereof, esters of unsaturated carboxylic acid and aliphatic polyvalent alcohol, and amide compounds of unsaturated carboxylic acid and aliphatic polyvalent amine compound. Specific examples of monomer of the ester of unsaturated carboxylic acid and aliphatic polyvalent alcohol include ethylene glycol di(meth)acrylate, triethylene glycol di(meth)acrylate, 1,3-butanediol di(meth)acrylate, tetramethylene glycol di(meth)acrylate, propylene glycol di(meth)acrylate, neopentyl glycol di(meth)acrylate, trimethylolpropane tri(meth)acrylate, trimethylolpropane tri((meth)acryloyloxypropyl)ether, trimethylolethane tri(meth)acrylate, hexanediol di(meth)acrylate, 1,4-cyclohexanediol di(meth)acrylate, tetraethylene glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol tetra(meth)acrylate, dipentaerythritol hexa(meth)acrylate, sorbitol tri(meth)acrylate, sorbitol tetra(meth)acrylate, sorbitol penta(meth)acrylate, sorbitol hexa(meth)acrylate, tri((meth)acryloyloxyethyl)isocyanurate, polyester(meth)acrylate oligomer, 2-phenoxyethyl(meth)acrylate, phenolethoxylate mono(meth)acrylate, 2-(p-chlorophenoxy)ethyl(meth)acrylate, p-chlorophenyl(meth)acrylate, phenyl(meth)acrylate, 2-phenylethyl(meth)acrylate, (2-(meth)acryloxyethyl)ether of bisphenol A, ethoxidized bisphenol A diacrylate, 2-(1-naphthyloxy)ethyl(meth)acrylate, o-biphenyl acrylate, 9,9-bis(4-(meth)acryloxydiethoxyphenyl)fluorene, 9,9-bis(4-(meth)acryloxytriethoxyphenyl)fluorene, 9,9-bis(4-acryloxydipropoxyphenyl)fluorene, 9,9-bis(4-acryloxyethoxy-3-methylphenyl)fluorene, 9,9-bis(4-acryloxyethoxy-3-ethylphenyl)fluorene, and 9,9-bis(4-acryloxyethoxy-3,5-dimethyl)fluorene or the like. Sulfur-contained acryl compounds disclosed in JP-A No. 61-72748 can also be used. Examples thereof include 4,4'-bis(β-(meth)acryloyloxyethylthio)diphenylsulfone, 4,4'-bis(β-(meth)acryloyloxyethylthio)diphenyl ketone, 4,4'-bis(β-(meth)acryloyloxyethylthio)-3,3',5,5'-tetrabromodiphenyl ketone, 2,4-bis(β-(meth)acryloyloxyethylthio)dipenyl ketone. However, acryl compounds which can be used are not limited to these examples.

Examples of the cationic photopolymerizable compound out of the second refractive index modulating component include cyclic ethers such as epoxy and oxetanyl rings, thioethers and vinyl ethers. Specific examples of the epoxy ring contained compound include polyalkylene glycol diglycidyl ether, bisphenol A diglycidyl ether, glycerin triglycidyl ether, diglycerol triglycidyl ether, diglycidyl hexahydrophthalate, trimethylolpropane diglycidyl ether, allyl glycidyl ether, phenyl glycidyl ether, and cyclohexene oxide. However, the epoxy ring contained compound is not limited to these examples.

As the anionic photopolymerizable compound out of the second refractive index modulating components, a vinyl monomer having an electron withdrawing property, that is, a monomer having an electron withdrawing group and an ethylenic double bond whose anionic polymerization activity is made high by the electron withdrawing group can be used. Examples of such a monomer include styrene, methyl α-cyanoacrylate, methyl vinyl ketone, and acrylonitrile. As the anionic polymerizable compound, there can be appropriately used a monomer having a chemical structure capable of undergoing ring-opening polymerization by an anionic catalyst, such as a cyclic ether, a lactone, a lactam, a cyclic urethane, a cyclic urea, or a cyclic siloxane.

By combining the fluorine-contained photoreactive compound represented by the formula (1) with a proper binder resin and/or a proper second refractive index modulating component, the refractive index modulation ($\Delta n$) after hologram-exposure can be made larger. Specific examples of an effective combination of materials for generating a refractive index difference inside interference fringes include the following:

(1) a combination comprising the fluorine-contained photosensitive compound represented by the formula (1), a binder resin having a refractive index different from that of the fluorine-contained photosensitive compound, and a radical photopolymerizable compound which is the second refractive index modulating component having a refractive index different from that of the fluorine-contained photosensitive compound;

(2) a combination comprising the fluorine-contained photosensitive compound represented by the formula (1), a binder resin having a refractive index different from that of the fluorine-contained photosensitive compound, and a cationic photopolymerizable compound which is the second refractive index modulating component having a refractive index different from that of the fluorine-contained photosensitive compound;

(3) a combination comprising the fluorine-contained photosensitive compound represented by the formula (1), and two or more radical photopolymerizable compounds which are the second refractive index modulating components each having a refractive index different from that of the fluorine-contained photosensitive compound; and (4) a combination comprising the fluorine-contained photosensitive compound represented by the formula (1), a radical photopolymerizable compound which is the second refractive index modulating component having a refractive index different from that of the fluorine-contained photosensitive compound, and a cationic photopolymerizable compound which is the second refractive index modulating component having a refractive index different from that of the fluorine-contained photosensitive compound.

In order to make the refractive index modulation Δn large by volume exclusion effect, it is also allowable to incorporate, into the volume hologram recording photosensitive composition of the present invention, metal fine particles having a refractive index different from that of the fluorine-contained photoreactive compound represented by the formula (1).

If the metal fine particles can diffuse and move in the volume hologlam recording material layer and have a refractive index different from that of the fluorine-contained photoreactive compound represented by the formula (1), the particles may be non-reactive metal fine particles or polymerization-reactive metal fine particles having surfaces onto which photopolymerization-reactive groups or other reactive groups are introduced.

About the metal fine particles, the difference of the refractive index thereof from the refractive index of the fluorine-contained photoreactive compound represented by the formula (1) is preferably made as large as possible. As the metal fine particles, selected is one satisfying a largeness and smallness relationship having the same tendency as the largeness and smallness relationship between the refractive index of the fluorine-contained photoreactive compound and that of the binder resin similarly to the second refractive index modulating component. From the viewpoint of diffusing/moving ability in the volume hologram recording material layer, the particle size of the metal fine particles is preferably not more than the wavelength for hologram recording. Specifically, the particle size is preferably from 1 to 700 nm, more preferably from 5 to 500 nm. The non-photopolymerizable metal fine particles are made of titania, zirconia, zinc, indium, tin or the like.

When the hologram recording material comprising the metal fine particles having a refractive index different from that of the fluorine-contained photoreactive compound represented by the formula (1) is subjected to hologram-exposure, a refractive index difference is generated by a difference in photoreactivity between the fluorine-contained photoreactive compound and the metal oxide in accordance with a mechanism similar to that in the case of the hologram recording material comprising the second refractive index modulating component.

The method for introducing a photopolymerization-reactive group onto the metal fine particles may be a method of using a coupling agent having photopolymerization reactivity to conduct surface treatment in a dry manner, a wet manner, a blend manner or some other manner, whereby the surfaces of the metal fine particles are subjected to coupling treatment. Examples of the metal fine particles onto which the photopolymerization-reactive group is introduced include titania, zirconia, zinc, indium, and tin or the like, as described above. The photopolymerization-reactive group to be introduced may be a polymerization-reactive group such as one contained in the second refractive index modulating component, that is, a group which can undergo the advance of polymerization in a reaction style such as radical photopolymerization, cationic photopolymerization, anionic photopolymerization, or polymerization via photodimerization. It is preferable that the differences of the refractive index and the polymerization rate from those of the fluorine-contained photoreactive compound represented by the formula (1) are as large as possible.

Though the metal fine particles can be incorporated, in a powdery form as they are, into the volume hologram recording photosensitive composition, it is preferable, from the viewpoint of the dispersibility thereof, to disperse the fine particles into any organic solvent and then incorporate into the composition. The organic solvent can be appropriately selected from examples which will be described later as a solvent used for the preparation of a coating liquid of the hologram recording photosensitive composition.

A visible laser beam is used to record holograms, and it is preferable to add a sensitizing dye to the volume hologram recording photosensitive composition in order to improve the sensitivity at a laser beam wavelength used for hologram-exposure.

It is preferable to use, as the sensitizing dye, a visible light sensitizing dye (that is, a sensitizing dye which exhibits sensitizing effect within a visible light range). Examples thereof include cyanine type, merocyanine type, coumalin type, ketocoumalin type, cyclopentanone type, cyclohexanone type, thiopyrylium type, quinoline type, styrylquinoline type, thioxanthene type, xanthene type, oxonol type, rhodamine type, and pyrylium salt type dyes.

Specific examples of the cyanine type and merocyanine type dyes include 3,3'-dicarboxylethyl-2,2'-thiocyanine bromide, 1-carboxymethyl-1'-carboxyethyl-2,2'-quinocyanine bromide, 1,3'-diethyl-2,2'-quinothiacyanine iodide, and 3-ethyl-5-[(3-ethyl-2(3H)-benzothiazolidene)ethylidene]-2-thioxo-4-oxazolidine. Specific examples of the coumalin type and ketocoumalin type dyes include 3-(2'-benzimidazol) 7-N,N'-diethylaminocoumalin, 3,3'-carbonylbis(7-diethylaminocoumalin), 3,3'-carbonylbiscoumalin, 3,3'-carbonylbis(5,7-dimethoxycoumalin), and 3,3'-carbonylbis(7-acetoxycoumalin). Specific examples of the cyclopentanone type dye include 2,5-bis(4-dimethylaminobenzilidene)cyclopentanone, 2,5-bis(4-diethylaminobenzilidene)cylopentanone, 2,5-bis(4-dipentylamonobenzilidene)cyclopentanone, 2,5-bis[4-(dimethylamino)phenyl]methylene-cyclopentanone, 2,5-bis[4-(diethylamino)phenyl]methylene-cyclopentanone, 2,5-bis[(2,3,6,7-tetrahydro-1H, 5H-benzo[i,j]quinolizine-1-yl)methylene]-cyclopentanone, 2,5-bis[2-(1,3-dihydro-1,3,3-trimethyl-2H-indole-2-ylidene)ethylidene]cyclopentanone, 2,5-bis[[2-ethylnaphtho[1,2-d]thiazole-2(1H)-ylidene]ethylidene]cyclopentanone, 2,5-bis[4'-(dimethylaminocynnamilidene)cyclopentanone, 2,5-bis[4'-N-ethyl-N-carbomethoxymethylaminobenzilidene]cyclopentanone and a sodium salt thereof, 2,5-bis(4'-N-methyl-N-cyanoethylaminobenzilidene)cyclopentanone, and 2,5-bis(4'-N-ethyl-N-chloroethylaminocynnamilidene)cyclopentanone. Specific examples of the cyclohexanone type dye include 2,6-bis{[4-

(diethylamino)-phenyl]methylene}-cyclohexanone, 2,6-bis{[4-(dimethylamino)-phenyl]methylene}-cyclohexanone, 2,6-bis(4'-N-cyanoethylaminobenzilidene)cyclohexanone, 2,6-bis(4-dimethylaminobenzilidene)cyclohexanone, and 2,6-bis(4-diethylaminobenzilidene)cyclohexanone. However, the sensitizing dye is not limited to these examples.

A sensitizing dye which becomes transparent in a subsequent process after recording a hologram or which is decomposed or changed in structure by heating or irradiation with ultraviolet rays so as to become transparent is preferable in the view of obtaining high transparency, and it is suitable to a case of requiring high transparency, for example, optical elements. Preferable examples of the dye which can be made transparent in the subsequent process include cyanine type, merocyanine type, coumalin type, ketocoumalin type, and cyclopentanone type dyes. The transparency referred to herein means that regions other than hologram recorded portions are transparent with the naked eye, or that the transmittance is 60% or more at a wavelength within the visible light range (wavelength: 400 to 700 nm).

These sensitizing dyes may be used alone or in the form of a mixture of two or more thereof.

When the volume hologram recording photosensitive composition according to the present invention contains the binder resin, the fluorine-contained photoreactive compound represented by the formula (1) is used preferably in an amount of 10 to 1000 parts by weight, more preferably in an amount of 10 to 160 parts by weight per 100 parts by weight of the binder resin. Any conventional fluorine-contained photoreactive compound, for example, a commercially available fluorine-contained photoreactive compound (trade name: Viscoat 17F, manufactured by Osaka Organic Chemical Industry Ltd.) can merely be contained up to an amount of about 35 parts by weight per 100 parts by weight of acrylic type binder resin in the view of compatibility with the other components. In contrast, the fluorine-contained photoreactive compound represented by the formula (1) can be contained in an amount of 1000 parts or more by weight with a result that the $\Delta n$ can be improved.

The photopolymerization initiator is used preferably in an amount of 0.1 to 30 parts by weight, more preferably in an amount of 2 to 20 parts by weight per 100 parts by weight of the binder resin.

The second refractive index modulating component is used preferably in an amount of 10 to 1000 parts by weight, more preferably in an amount of 10 to 160 parts by weight per 100 parts by weight of the binder resin.

About the blend ratio between the fluorine-contained photoreactive compound represented by the formula (1) and the second refractive index modulating component, the second refractive index modulating component is used preferably in an amount of 1 to 1000 parts by weight, more preferably in 100 to 700 parts by weight per 100 parts by weight of the fluorine-contained photoreactive compound.

The sensitizing dye is used preferably in an amount of 0.01 to 20 parts by weight, more preferably in an amount of 0.01 to 10 parts by weight per 100 parts by weight of the binder resin.

Appropriate amounts of various additives, such as a plasticizer, an adhesiveness control agent (adhesiveness supplier), and an antioxidant, besides the above-mentioned components, may be appropriately incorporated into the composition dependently on the purpose of the composition.

A coating liquid for the application of the volume hologram recording photosensitive composition according to the present invention can be prepared by dissolving the above-mentioned respective materials into acetone, methyl ethyl ketone, methyl isobutyl ketone, cyclohexanone, benzene, toluene, xylene, chlorobenzene, tetrahydrofuran, methylcellosolve, ethylcellosove, methylcellosove acetate, ethylcellosolve acetate, ethyl acetate, 1,4-dioxane, 1,2-dichloroethane, dichloromethane, chloroform, methanol, ethanol, isopropanol or a mixed solvent thereof. However, when the fluorine-contained photoreactive compound or the other blend components are in a liquid form at ambient temperature, the use amount of the coating solvent can be reduced, and there may be a case in which no coating solvent is necessary.

The coating liquid is applied to a suitable support such as a substrate film by spin coating, gravure coating, comma coating, bar coating or some other coating, and then dried, thereby forming a layer made of the volume hologram recording photosensitive composition (hereinafter referred to as a "volume hologram recording material layer"). In this way, a volume hologram recording photosensitive medium is yielded. The thickness of the volume hologram recording material layer is preferably set to 1 to 100 µm, more preferably 2 to 40 µm.

When the fluidity of the volume hologram recording photosensitive composition is high, a volume hologram recording section may be formed by putting said volume hologram recording photosensitive composition air-tightly into a space formed between the support and an opposed covering material having transparency such as a transparent substrate or a plastic film.

The substrate film of the volume hologram recording photosensitive medium may be a film having transparency, and examples thereof include polyethylene, polypropylene, fluorinated polyethylene, fluorinated polyvinylidene, polyvinyl chloride, polyvinylidene chloride, ethylene-vinyl alcohol copolymer, polyvinyl alcohol, polymethylmethacrylate, polyethersulfone, polyetheretherketone, polyamide, tetrafluoroethylene-perfluoroalkyl vinyl ether copolymer, polyester (such as polyethylene terephthalate), and polyimide films. The film thickness thereof may be from 2 to 200 µm, and is preferably from 10 to 50 µm.

When the volume hologram recording material layer after being dried is adhesive, anyone of the films exemplified above as the substrate film can be laminated thereon as a protective film. In this case, the contact surface of the laminated film with the volume hologram recording material layer may be subjected to releasing treatment in order that the film will easily be peeled afterwards.

The volume hologram recording photosensitive medium obtained as described above is a medium wherein a hologram recording section made of the volume hologram recording material is disposed on the support. The hologram recording section is a section containing the fluorine-contained photoreactive compound represented by the formula (1), and is usually the volume hologram recording material layer having a given thickness but may be in any form in which a hologram can be recorded. Thus, the shape or thickness thereof is not limited. Furthermore, it is unnecessary that the thickness is constant. As described above, it may be in a form in which the composition in a fluid state is air-tightly sealed.

The volume hologram recording photosensitive medium according to the present invention can be subjected to hologram-exposure by any known method, whereby forming a volume hologram.

For example, a volume hologram is formed in such manner that if necessary, the hologram recording material layer of the volume hologram recording photosensitive medium is beforehand irradiated with relatively weak light homogenously, thereby polymerizing the photoreactive components, such as the fluorine-contained photoreactive compound, to some degree, and subsequently a hologram original plate is opposed and adhered to the layer, and the resultant is subjected to hologram-exposure with a visible laser beam from its transparent substrate film side.

The recording light which can be used for recording the hologram may be any light that can cause polymerization reaction of the fluorine-contained photoreactive compound represented by the formula (1). Examples thereof include electromagnetic waves having a wavelength within the visible light range and non-visible light range, corpuscular rays such as an electron beam, and radioactive rays or ionizing radioactive rays which is a generic terms including electromagnetic waves and particle beams.

It is preferable to use, as reference light, a laser beam having high coherency, for example, an argon ion laser (458 nm, 488 nm or 514.5 nm), a krypton ion laser (647.1 nm), a YAG laser (532 nm) or some other laser to form interference fringes and perform exposure.

The volume hologram recording mechanism of the volume hologram recording photosensitive composition of the present invention can be considered to be the same mechanism as has been stated hitherto. That is, when the film-form photosensitive composition (that is, the hologram recording material layer) is subjected to hologram-exposure, the fluorine-contained photoreactive compounds are photopolymerized in regions of the hologram recording material layer in which the light is intensely radiated and a concentration gradient of the fluorine-contained photoreactive compounds is generated accordingly. Thus, the fluorine-contained photoreactive compounds diffuse and move from weakly-exposed regions to the intensely exposed regions. As a result, the fluorine-contained photoreactive compounds become dense or thin in accordance with the intensity or weakness of the interference light so as to exhibit a refractive index difference. In this case, the refractive index is lower in regions exposed to light having a larger intensity. This refractive index difference generates interference fringes to form a volume hologram.

When the film-form hologram recording photosensitive composition which comprises the binder resin is subjected to hologram-exposure, the weakly-exposed regions are rich in the binder resin, and becomes closer to the refractive index of the binder resin itself. On the other hand, the intensely exposed regions are rich in the fluorine-contained photoreactive compound or a polymer produced therefrom, and becomes closer to the refractive index of the fluorine-contained photoreactive compound itself. Since the refractive index of the fluorine-contained photoreactive compound is usually lower than that of the binder resin, the refractive index in the weakly-exposed regions, which are rich in the binder resin, becomes high while the refractive index in the intensely exposed regions, which are rich in the fluorine-contained photoreactive compound or the polymer produced therefrom, becomes low. As a result thereof, a refractive index modulation can be made very large by the refractive index difference between the binder resin and the fluorine-contained photoreactive compound.

When the volume hologram recording photosensitive composition comprises the second refractive index modulating component together with the fluorine-contained photoreactive compound, the fluorine-contained photoreactive compound and the second refractive index modulating component diffuse and move so that one having a larger polymerization rate out of the two is unevenly located in intensely exposed regions and the other, which has a smaller polymerization rate, is unevenly located in weakly-exposed regions. As a result, concentration of the fluorine-contained photoreactive compounds become dense or thin in accordance with the intensity or weakness of the interference light so as to exhibit a refractive index difference. This refractive index difference generates interference fringes to form a volume hologram.

After the hologram-exposure, if one or more selected from swelling treatment for tuning a hologram reproducing wavelength or tuning the half band width of the spectral transmittance curve, entire-surface exposure treatment based on uniform light radiation, and heating treatment are conducted in an appropriate order as required, polymerization reaction of the photoreactive components in unreacted state can be promoted, and the refractive index modulation ($\Delta n$) can be made larger, and further the photopolymerization initiator or the sensitizing dye can be inactivated to improve the endurance of the volume hologram, for example, the heat resistance and moisture resistance, thus being preferable.

In the uniform light radiation after the hologram-exposure, light having a wavelength within the visible light range may be not necessarily used. Ultraviolet rays may be used. For example, a light source such as a superhigh-pressure mercury lamp, a high-pressure mercury lamp, a carbon arc, a xenon arc, or a metal halide lamp is used to perform the light radiation in such a manner that the total exposure quantity will be generally from about 0.1 to 10000 $mJ/cm^2$, preferably from 10 to 4000 $mJ/cm^2$.

When the heating treatment is conducted after the hologram-exposure, this treatment is conducted instead of the uniform light radiation or before or after the uniform light radiation. By the heating treatment, phase-separation is promoted so that the photoreactive components in an unpolymerized status present in the volume hologram recording photosensitive composition diffuse and move to complete the polymerization, thereby increasing and fixing the refractive index modulation ($\Delta n$). Moreover, the solvent is vaporized so as to make the refractive index modulation ($\Delta n$) larger and further so as to improve the endurance of the volume hologram such as the heat resistance or moisture resistance as well as in the case of performing the entire-surface exposure to ultraviolet rays. The temperature range for the heating treatment is usually from 40 to 150° C., preferably from 40 to 100° C., and the time for the heating treatment is usually from 5 to 120 minutes, preferably from 5 to 30 minutes.

As described above, hologram-exposure causes interference fringes to be generated in the hologram recording material layer of the volume hologram recording photosensitive medium according to the present invention, so that this layer is converted to a hologram layer, thereby obtaining a volume hologram. According to the present invention, a volume hologram having a large refractive index modulation ($\Delta n$) can be produced and a volume hologram wherein the refractive index modulation ($\Delta n$) between its low refractive index regions and its high refractive index regions is 0.016 or more, preferably 0.025 or more can be produced.

The following describes a method of producing a hologram transfer foil, which is one specific example of a product produced using the photosensitive composition of the present invention. A hologram transfer foil is a product wherein a transfer layer comprising a hologram layer is laid on a support, and this is used to allow a hologram to be easily applied to a transfer-receiving surface of various objects.

FIG. 1 illustrates an example of the hologram transfer foil. The hologram transfer foil 1 has a structure wherein a peelable layer 6, a hologram layer 4 and an adhesive layer 5 are successively laid on one surface of a support 2. The peelable layer 6, the hologram layer 4 and the adhesive layer 5 constitute a transfer layer 3.

The method for producing this hologram transfer foil 1 may be a method of laying the peelable layer 6, a hologram recording material layer, and the adhesive layer 5 successively on the support 2 by coating and then recording a hologram into the hologram recording material layer. Another method may be a method of laying the peelable layer 6 and a hologram recording material layer successively on the support 2 by coating, recording a hologram into the hologram recording material layer to form the hologram layer 4, and then laying the adhesive layer 5 on the hologram layer 4 by coating or laminating the adhesive layer 5 formed on another film on the hologram layer 4.

A preferable method for producing the hologram transfer foil 1 is a method comprising the processes of providing a film having a hologram recording material layer and another film having an adhesive layer individually by a process independent per each film, and afterward laying them in combination therewith on a given purpose.

Specifically, the method comprises the processes of providing a first film having a hologram recording material layer, a second film having an adhesive layer, and a third film having a peelable layer individually by a process independent per each film, forming a hologram image within the hologram recording material layer of the first film, and subsequently laying the second and third films thereon. The lamination of the first film to the third film can be performed by dry process, which need not use any solvent, thus being profitable for the producing process.

The method for producing the hologram transfer foil 1 may be a method in which a film having a hologram recording material layer and a peelable layer and a film having an adhesive layer are provided individually by a process independent per each film, or a method in which a film having a hologram recording material layer and an adhesive layer and a film having a peelable layer are provided individually by a process independent per each film.

The above-mentioned first film may be a laminate wherein a hologram recording material layer is formed on a supporting film such as a PET film and further a peelable PET film is laid thereon (PET film/hologram recording material layer/peelable PET film). The second film may be a laminate wherein an adhesive layer is formed on a peelable PET film and further a peelable PET film is formed on this adhesive layer (peelable PET film/adhesive layer/peelable PET film). The adhesive layer may be made of a thermosensitive adhesive, ordinary adhesive or the like. The third film may be a laminate wherein a peelable layer is formed on a supporting film made of PET or the like (PET film/peelable layer).

A specific example of the method of using the above-mentioned first, second and third films to produce a volume hologram type hologram transfer foil is as follows.

First, the hologram recording material layer of the first film is subjected to hologram-exposure to record a given hologram image therein. Thereafter, the peelable PET film is peeled and removed so that the peelable layer of the third film is faced and laminated onto the hologram layer of the first film. Next, this is introduced into a developing line if necessary, and then subjected to given heating treatment and UV treatment to promote a variation in the refractive index and fix the image. Furthermore, the supporting film laid on the hologram layer is peeled and removed to make the hologram layer naked. The adhesive layer of the second film is faced and laminated onto the hologram image, thereby yielding a layer structure of the peelable PET film/the adhesive layer/the hologram layer/the peelable layer/the PET film (supporting film). When the adhesive layer is a thermosensitive adhesive layer, the adhesive layer can be adhered to the hologram layer by laminating the second film onto the hologram layer under heating condition (for example, at 100 to 180° C.). Furthermore, the peelable PET film is peeled therefrom, whereby the hologram transfer foil can be yielded.

Figure 2:
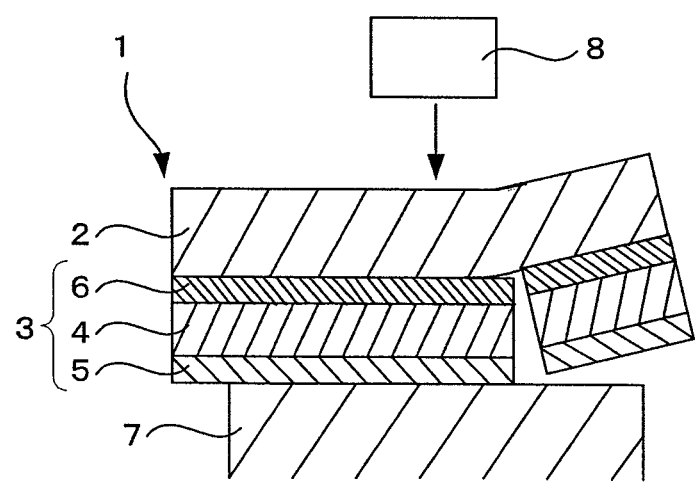
FIG. 2 is an explanatory view of an example of transferring operation with the use of the hologram transfer foil.

FIG. 2 is an explanatory view illustrating an example of transferring operation using the resultant hologram transfer foil. When the hologram transfer foil 1 of the present invention is used to perform transfer, the hologram transfer foil 1 of the present invention is laid on a surface of a transfer receiving material 7 to be provided with a hologram in such a manner that the adhesive layer 5 of the transfer foil 1 is brought into contact with the transfer receiving material 7, as illustrated in FIG. 2. The upper (i.e., the support 2 side) of the transfer foil 1 in a portion where a hologram is to be given is then pressed through a pressing plate 8 or the like. Thereafter, when the transfer foil is peeled, only the transfer layer in desired portions is transferred onto the surface of the transfer receiving material 7 so that the hologram can be given. When the adhesive layer 5 is a thermosensitive adhesive layer, heating is performed at the same time of the pressing through the pressing plate 8 or the like so that the thermosensitive adhesive layer in the desired portions is allowed to melt and adhere to the transfer receiving material 7. When the adhesive layer 5 is an ordinary adhesive layer, the hologram layer is allowed to adhere to the transfer receiving material 7 by only the pressing through the pressing plate 8 or the like.

As described above, in the volume hologram recording photosensitive composition according to the present invention, a fluorine-contained photoreactive compound having a structure represented by the formula (1) is used as a refractive index modulating component. This fluorine-contained photoreactive compound has a very low refractive index and is further superior in compatibility with other blend components such as a binder resin and polymerization reactivity and diffusing/moving ability at the time of hologram-exposure. Therefore, this compound is suitable for a low refractive index type refractive index modulating component. By incorporating this component, as a refractive index modulating component, into a volume hologram recording photosensitive composition, superior sensitivity and refractive index modulating effect can be obtained.

By adding, to this fluorine-contained photoreactive compound, other blend components such as a photopolymerization initiator, a binder resin, metal fine particles and a sensitizing dye appropriately, a non-fluid volume hologram recording layer can be formed on a substrate. Thus, a dry-developable volume hologram recording photosensitive medium having a good sensitivity and a large refractive index modulation can be obtained.

Accordingly, provided are a volume hologram recording material, a volume hologram recording medium and a volume hologram which are superior in hologram recording performances, such as a refractive index modulation and sensitivity.

When a binder resin capable of forming a covalent bond with the fluorine-contained photoreactive compound is used as the binder resin in the present invention, the layer strength and the heat resistance of the hologram layer can be improved.

In this case, it is possible to provide a volume hologram recording material, a volume hologram recording medium and a volume hologram which are superior in not only hologram recording performances, such as a refractive index modulation, sensitivity and transparency but also physical properties such as strength and heat resistance. Thus, it is expected that these are applied to wide fields such as an optical element or the like.

When the binder resin capable of forming a covalent bond with the fluorine-contained photoreactive compound is a binder resin the functional group of which can be photopolymerized with a photoreactive group of the fluorine-contained photoreactive compound at the time of hologram-exposure, the fluorine-contained photoreactive compound is also polymerized with the binder resin in intensely exposed regions so that the reactivity thereof is increased. Consequently, the refractive index modulation and the sensitivity can be further improved.

EXAMPLES

The present invention will be described hereafter by way of the examples.

1. Production of a Volume Hologram

Example 1

(1) Preparation of a Volume Hologram Recording Photosensitive Composition

The following components were mixed to yield a volume hologram recording photosensitive composition.
<Composition>

Acrylic resin (trade name: BR-73, manufactured by Mitsubishi Rayon Co., Ltd.): 100 parts by weight Fluorine-contained photoreactive compound represented by the following formula (5) (synthesized with reference to methods described in JP-B No. 54-11284, 59-22712, and 6-60116, J. Fluorine Chem., 73, 151 (1995) and so on): 70 parts by weight Formula (5)

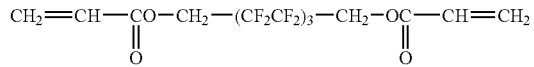

Irgacure 784 (manufactured by Ciba Specialty Chemicals, inc.): 5 parts by weight Methanol: 30 parts by weight Methyl ethyl ketone: 30 parts by weight (2) Production of a Volume Hologram Recording Photosensitive Medium The above-mentioned volume hologram recording photosensitive composition was applied onto a polyethylene terephthalate (referred to as PET hereinafter) film (trade name: LUMIRROR T-60, manufactured by Toray Industries, Inc.) having a thickness of 38 μm with a bar coater to form a hologram recording material layer having a thickness of 20 μm after being dried. In this way, a volume hologram recording photosensitive medium was produced.

(3) Production of a Volume Hologram

The volume hologram recording photosensitive medium was laminated onto a mirror in such a manner that its hologram recording material layer contacted the mirror. An argon laser beam having a wavelength of 514.5 nm was radiated into the medium from its PET film side so as to conduct hologram-exposure. In this way, a volume hologram was recorded.

Next, the interference fringes were fixed by heating and irradiation with ultraviolet rays, to yield a volume hologram.

Example 2

A volume hologram was produced in the same conditions as in Example 1 except that the composition of the volume hologram recording photosensitive composition was changed as follows.

<Composition>

Vinyl acetate-acrylic copolymer resin (copolymer of vinyl acetate/ethyl acrylate/acrylic acid (composition ratio=50/45/5)) prepared by radical polymerization in a usually way, weight average molecular weight=100000): 100 parts by weight Fluorine-contained photoreactive compound represented by the following formula (5) (synthesized with reference to methods described in JP-B No. 54-11284, 59-22712, and 6-60116, J. Fluorine Chem., 73, 151 (1995) and so on): 70 parts by weight Formula (5)

$CH_2\!=\!CH\!-\!\underset{O}{\overset{\|}{C}}\!-\!O\!-\!CH_2\!-\!(CF_2CF_2)_3\!-\!CH_2\!-\!O\!-\!\underset{O}{\overset{\|}{C}}\!-\!CH\!=\!CH_2$ Fluorene skeleton-contained compound represented by the following formula (6) (synthesized by a known method from bisphenoxyethanol fluorene and epichlorohydrin): 80 parts by weight Formula (6)

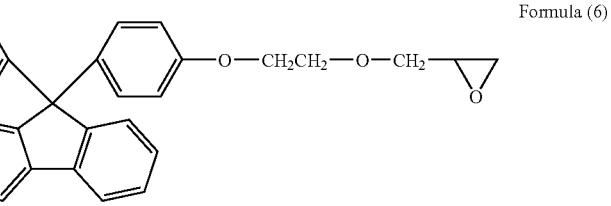

Diaryl iodonium salt (trade name: PI2074, manufactured by Rhodia): 5 parts by weight 3-Ethyl-5-[(3-ethyl-2(3H)-benzothiazolilidene)ethylidene]-2-thioxo-4-oxazolidinone (trade name: NK-1473, manufactured by Hayashibara Biochemical Laboratories, Inc.): 2 parts by weight Methanol: 30 parts by weight Methyl ethyl ketone: 30 parts by weight

Example 3

A volume hologram was produced in the same conditions as in Example 1 except that the composition of the volume hologram recording photosensitive composition was changed as follows.

<Composition>

Vinyl acetate-acrylic copolymer resin (copolymer of vinyl acetate/ethyl acrylate/acrylic acid (composition ratio=50/45/

5)) prepared by radical polymerization in a usually way, weight average molecular weight=100000): 100 parts by weight Fluorine-contained photoreactive compound represented by the following formula (5) (synthesized with reference to methods described in JP-B No. 54-11284, 59-22712, and 6-60116, J. Fluorine Chem., 73, 151 (1995) and so on): 70 parts by weight, Formula (5)
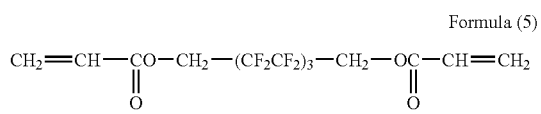

Polyethylene glycol diacrylate (trade name: A-400, manufactured by Shin-Nakamura Chemical Co., Ltd.): 20 parts by weight Fluorene skeleton-contained compound represented by the following formula (6) (synthesized by a known method from bisphenoxyethanol fluorene and epichlorohydrin): 80 parts by weight Formula (6)
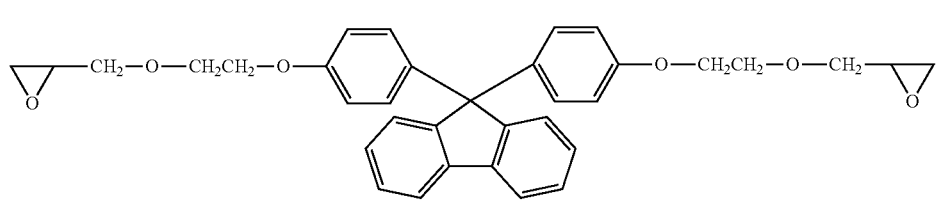

Diaryl iodonium salt (trade name: PI2074, manufactured by Rhodia): 5 parts by weight 3-Ethyl-5-[(3-ethyl-2(3H)-benzothiazolilidene)ethylidene]-2-thioxo-4-oxazolidinone (trade name: NK-1473, manufactured by Hayashibara Biochemical Laboratories, Inc.): 2 parts by weight Methanol: 30 parts by weight Methyl ethyl ketone: 30 parts by weight Example 4

A volume hologram was produced in the same conditions as in Example 1 except that the composition of the volume hologram recording photosensitive composition was changed as follows.

<Composition>

Fluorine-contained photoreactive compound represented by the following formula (5) (synthesized with reference to methods described in JP-B No. 54-11284, 59-22712, and 6-60116, J. Fluorine Chem., 73, 151 (1995) and so on): 70 parts by weight Formula (5)
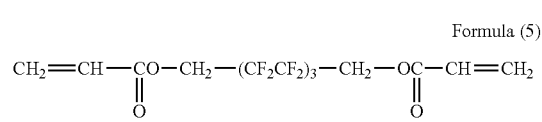

Polyethylene glycol diacrylate (trade name: A-400, manufactured by Shin-Nakamura Chemical Co., Ltd.): 20 parts by weight Fluorene skeleton-contained compound represented by the following formula (6) (synthesized by a known method from bisphenoxyethanol and epichlorohydrin): 80 parts by weight Formula (6)
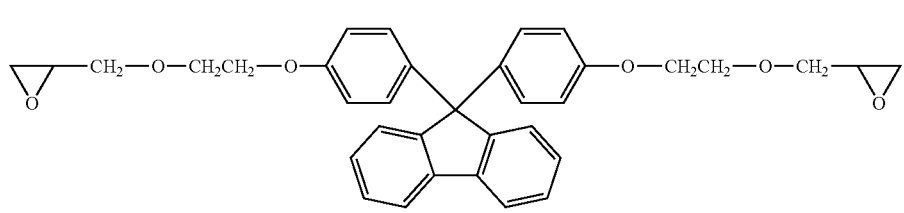

Diaryl iodonium salt (trade name: PI2074, manufactured by Rhodia): 5 parts by weight 3-Ethyl-5-[(3-ethyl-2(3H)-benzothiazolilidene)ethylidene]-2-thioxo-4-oxazolidinone (trade name: NK-1473, manufactured by Hayashibara Biochemical Laboratories, Inc.): 2 parts by weight, Methanol: 30 parts by weight Methyl ethyl ketone: 30 parts by weight Example 5

A volume hologram was produced in the same conditions as in Example 1 except that the composition of the volume hologram recording photosensitive composition was changed as follows.

<Composition>

Fluorine-contained photoreactive compound represented by the following formula (5) (synthesized with reference to methods described in JP-B No. 54-11284, 59-22712, and 6-60116, J. Fluorine Chem., 73, 151 (1995) and so on): 70 parts by weight

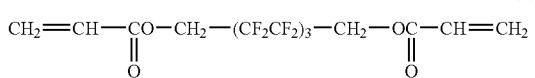

Formula (5)

Polyethylene glycol diacrylate (trade name: A-400, manufactured by Shin-Nakamura Chemical Co., Ltd.): 20 parts by weight Bisphenol type epoxy oligomer (trade name: Epikote 1007, manufactured by Japan Epoxy Resins Co., Ltd.): 180 parts by weight Diaryl iodonium salt (trade name: PI2074, manufactured by Rhodia): 10 parts by weight 3-Ethyl-5-[(3-ethyl-2(3H)-benzothiazolilidene)ethylidene]-2-thioxo-4-oxazolidinone (trade name: NK-1473, manufactured by Hayashibara Biochemical Laboratories, Inc.): 2 parts by weight Methanol: 50 parts by weight Methyl ethyl ketone: 50 parts by weight Example 6

A volume hologram was produced in the same conditions as in Example 1 except that the composition of the volume hologram recording photosensitive composition was changed as follows.

<Composition>

Vinyl acetate-acrylic copolymer resin (copolymer of vinyl acetate/ethyl acrylate/acrylic acid (composition ratio=50/45/5)) prepared by radical polymerization in a usually way, weight average molecular weight=100000): 100 parts by weight Fluorine-contained photoreactive compound represented by the following formula (7) (trade name: E-7432, manufactured by Daikin Industries, Ltd.): 70 parts by weight

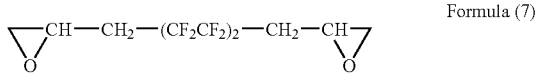

Formula (7)

Diaryl iodonium salt (trade name: PI2074, manufactured by Rhodia): 5 parts by weight 3-Ethyl-5-[(3-ethyl-2(3H)-benzothiazolilidene)ethylidene]-2-thioxo-4-oxazolidinone (trade name: NK-1473, manufactured by Hayashibara Biochemical Laboratories, Inc.): 2 parts by weight Methanol: 30 parts by weight Methyl ethyl ketone: 30 parts by weight Example 7

A volume hologram was produced in the same conditions as in Example 1 except that the composition of the volume hologram recording photosensitive composition was changed as follows.

<Composition>

Acrylic resin (trade name: BR-73, manufactured by Mitsubishi Rayon Co., Ltd.): 100 parts by weight Fluorine-contained photoreactive compound represented by the following formula (7) (trade name: E-7432, manufactured by Daikin Industries, Ltd.): 70 parts by weight,

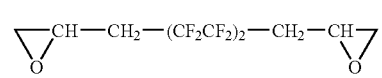

Formula (7)

Polyethylene glycol diglycidyl ether (trade name: DENACOL EX-821, manufactured by Nagase ChemteX Corporation): 30 parts by weight Diaryl iodonium salt (trade name: PI2074, manufactured by Rhodia): 5 parts by weight 3-Ethyl-5-[(3-ethyl-2(3H)-benzothiazolilidene)ethylidene]-2-thioxo-4-oxazolidinone (trade name: NK-1473, manufactured by Hayashibara Biochemical Laboratories, Inc.): 2 parts by weight Methanol: 30 parts by weight Methyl ethyl ketone: 30 parts by weight Example 8

A volume hologram was produced in the same conditions as in Example 1 except that the composition of the volume hologram recording photosensitive composition was changed as follows.

<Composition>

Acrylic resin (trade name: BR-73, manufactured by Mitsubishi Rayon Co., Ltd.): 100 parts by weight Fluorine-contained photoreactive compound represented by the following formula (7) (trade name: E-7432, manufactured by Daikin Industries, Ltd.): 150 parts by weight

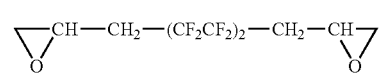

Formula (7)

9,9-Bis(4-acryloxydiethoxyphenyl)fluorene (synthesized by a known method from bisphenoxyethanol fluorene and acrylic acid): 150 parts by weight Diaryl iodonium salt (trade name: PI2074, manufactured by Rhodia): 10 parts by weight 3-Ethyl-5-[(3-ethyl-2(3H)-benzothiazolilidene)ethylidene]-2-thioxo-4-oxazolidinone (trade name: NK-1473, manufactured by Hayashibara Biochemical Laboratories, Inc.): 2 parts by weight Methanol: 50 parts by weight Methyl ethyl ketone: 50 parts by weight Example 9

A volume hologram was produced in the same conditions as in Example 1 except that the composition of the volume hologram recording photosensitive composition was changed as follows.

<Composition>

Acrylic resin (trade name: BR-73, manufactured by Mitsubishi Rayon Co., Ltd.): 100 parts by weight Fluorine-contained photoreactive compound represented by the following formula (7) (trade name: E-7432, manufactured by Daikin Industries, Ltd.): 150 parts by weight

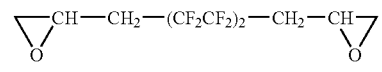

Formula (7)

4,4'-bis(β-methacryloyloxyethylthio)diphenylsulfone: 150 parts by weight

Diaryl iodonium salt (trade name: PI2074, manufactured by Rhodia): 10 parts by weight 3-Ethyl-5-[(3-ethyl-2(3H)-benzothiazolilidene)ethylidene]-2-thioxo-4-oxazolidinone (trade name: NK-1473, manufactured by Hayashibara Biochemical Laboratories, Inc.): 2 parts by weight Methanol: 50 parts by weight Methyl ethyl ketone: 50 parts by weight Example 10

A volume hologram was produced in the same conditions as in Example 1 except that the composition of the volume hologram recording photosensitive composition was changed as follows.

<Composition>

Acrylic resin (trade name: BR-73, manufactured by Mitsubishi Rayon Co., Ltd.): 100 parts by weight Fluorine-contained photoreactive compound represented by the following formula (7) (trade name: E-7432, manufactured by Daikin Industries, Ltd.): 75 parts by weight

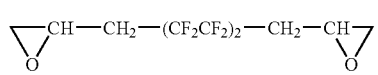

Formula (7)

Polyethyleneglycol diglycidyl ether (trade name: DENACOL EX-821, manufactured by Nagase ChemteX Corporation): 50 parts by weight 9,9-Bis(4-acryloxydiethoxyphenyl)fluorene (synthesized by a known method from bisphenoxyethanol fluorene and acrylic acid): 80 parts by weight Diaryl iodonium salt (trade name: PI2074, manufactured by Rhodia): 5 parts by weight 3-Ethyl-5-[(3-ethyl-2(3H)-benzothiazolilidene)ethylidene]-2-thioxo-4-oxazolidinone (trade name: NK-1473, manufactured by Hayashibara Biochemical Laboratories, Inc.): 2 parts by weight Methanol: 30 parts by weight Methyl ethyl ketone: 30 parts by weight Example 11

A volume hologram was produced in the same conditions as in Example 1 except that the composition of the volume hologram recording photosensitive composition was changed as follows.

<Composition>

Epoxy group-contained acrylic resin (trade name: Blemer CP-50S, manufactured by NOF Corporation): 100 parts by weight Fluorine-contained photoreactive compound represented by the following formula (5) (synthesized with reference to methods described in JP-B No. 54-11284, 59-22712, and 6-60116, J. Fluorine Chem., 73, 151 (1995) and so on): 70 parts by weight

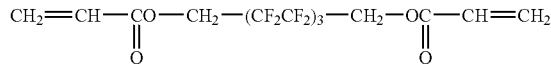

Formula (5)

9,9-Bis(4-acryloxydiethoxyphenyl)fluorene (synthesized by a known method from bisphenoxyethanol fluorene and acrylic acid): 80 parts by weight Diaryl iodonium salt (trade name: PI2074, manufactured by Rhodia): 5 parts by weight 3-Ethyl-5-[(3-ethyl-2(3H)-benzothiazolilidene)ethylidene]-2-thioxo-4-oxazolidinone (trade name: NK-1473, manufactured by Hayashibara Biochemical Laboratories, Inc.): 2 parts by weight Methanol: 30 parts by weight Methyl ethyl ketone: 30 parts by weight Example 12

A volume hologram was produced in the same conditions as in Example 1 except that the composition of the volume hologram recording photosensitive composition was changed as follows.

<Composition>

Vinyl acetate-acrylic copolymer resin (copolymer of vinyl acetate/ethyl acrylate/acrylic acid (composition ratio=50/45/5)) prepared by radical polymerization in a usually way, weight average molecular weight=100000): 100 parts by weight Fluorine-contained photoreactive compound represented by the following formula (5) (synthesized with reference to methods described in JP-B No. 54-11284, 59-22712, and 6-60116, J. Fluorine Chem., 73, 151 (1995) and so on): 70 parts by weight

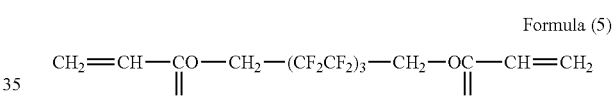

Formula (5)

Titania-dispersed solution (titania particle size=30 nm, MIBK solution, solid content=30%): 30 parts by weight Diaryl iodonium salt (trade name: PI2074, manufactured by Rhodia): 5 parts by weight 3-Ethyl-5-[(3-ethyl-2(3H)-benzothiazolilidene)ethylidene]-2-thioxo-4-oxazolidinone (trade name: NK-1473, manufactured by Hayashibara Biochemical Laboratories, Inc.): 2 parts by weight Methanol: 30 parts by weight Methyl ethyl ketone: 30 parts by weight Example 13

(1) Preparation of Zirconia Fine Particles onto Which an Ethylenically Unsaturated Bond was Introduced There was used a coupling agent, 3-acryloxypropyltrimethoxysilane having an ethylenically unsaturated double bond (trade name: KBM 5103, manufactured by Shin-Etsu Chemical Co., Ltd.). The coupling agent was added to a zirconia dispersed solution (zirconia particle size: 30 nm, MIBK solution) prepared so as to have a solid content of 30% in such a manner that the concentration of the coupling agent would be 2% by weight of the zirconia while the solution was stirred. The solution was further stirred, and then subjected to filtration and drying so as to yield target zirconia fine particles onto which the ethylenically unsaturated bond was introduced. As the method for surface-treating metal fine particles, dry, wet, blend and other methods are known. According to anyone of the methods, surfaces of the metal fine particles can be coupling-treated.

(2) Production of a Volume Hologram Recording Photosensitive Composition, a Volume Hologram Recording Photosensitive Medium, and a Volume Hologram A volume hologram was produced in the same conditions as in Example 1 except that the composition of the volume hologram recording photosensitive composition was changed as follows.

<Composition>

Acrylic resin (trade name: BR-73, manufactured by Mitsubishi Rayon Co., Ltd.): 20 parts by weight Fluorine-contained photoreactive compound represented by the following formula (7) (trade name: E-7432, manufactured by Daikin Industries, Ltd.): 75 parts by weight

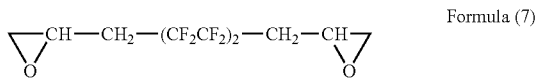

Formula (7)

The above-mentioned zirconia fine particles onto which the ethylenically unsaturated bond was introduced: 60 parts by weight Diaryl iodonium salt (trade name: PI2074, manufactured by Rhodia): 3 parts by weight 3-Ethyl-5-[(3-ethyl-2(3H)-benzothiazolilidene)ethylidene]-2-thioxo-4-oxazolidinone (trade name: NK-1473, manufactured by Hayashibara Biochemical Laboratories, Inc.): 1 part by weight Methanol: 30 parts by weight Methyl ethyl ketone: 30 parts by weight Example 14

(1) Preparation of an Organic-Inorganic Hybrid Polymer Starting Solution

Ethyl acrylate (manufactured by KANTO KAGAKU) and 3-acryloxypropyltrimethoxysilane (trade name: KBM 5103, manufactured by Shin-Etsu Chemical Co., Ltd.) with 6:4 in terms of mole ratio are polymerized for 8 hours under reflux using benzene as a solvent and benzoyl peroxide as a polymerization initiator. After the end of the reaction, unreacted products and benzene were removed to purify and subjected to drying under decompression to yield a polymer.

The resultant polymer was dissolved into acetone, and thereto were added water, hydrochloric acid, and zirconium butoxide (trade name: ORGATIX ZA60, manufactured by Matsumoto Chemical Industry Co., Ltd.) so as to advance sol-gel reaction, thereby yielding a target organic-inorganic hybrid polymer starting solution.

(2) Production of a Volume Hologram Recording Photosensitive Composition, a Volume Hologram Recording Photosensitive Medium, and a Volume Hologram A volume hologram was produced in the same conditions as in Example 1 except that the composition of the volume hologram recording photosensitive composition was changed as follows.

<Composition>

The above-mentioned organic-inorganic hybrid polymer solution: 100 parts by weight (solid content)

Fluorine-contained photoreactive compound represented by the following formula (7) (trade name: E-7432, manufactured by Daikin Industries, Ltd.): 75 parts by weight

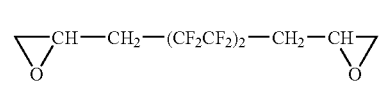

Formula (7)

Diaryl iodonium salt (trade name: PI2074, manufactured by Rhodia): 5 parts by weight, 3-Ethyl-5-[(3-ethyl-2(3H)-benzothiazolilidene)ethylidene]-2-thioxo-4-oxazolidinone (trade name: NK-1473, manufactured by Hayashibara Biochemical Laboratories, Inc.): 2 parts by weight Methanol: 30 parts by weight Methyl ethyl ketone: 30 parts by weight Example 15

A volume hologram was produced in the same conditions as in Example 1 except that the composition of the volume hologram recording photosensitive composition was changed as follows.

<Composition>

Acrylic resin (trade name: BR-73, manufactured by Mitsubishi Rayon Co., Ltd.): 100 parts by weight Fluorine-contained photoreactive compound represented by the following formula (8) (synthesized with reference to methods described in JP-B No. 54-11284, 59-22712 and 6-60116, JP-A No. 2000-336082, J. Fluorine Chem., 73, 151 (1995) and so on): 75 parts by weight

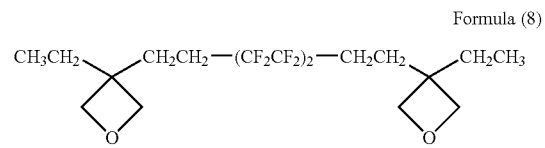

Formula (8)

1,6-Hexanediol diglycidyl ether (trade name: DENACOL EX-212, manufactured by Nagase ChemteX Corporation): 50 parts by weight 9,9-Bis(4-acryloxydiethoxyphenyl)fluorene (synthesized by a known method from bisphenoxyethanol fluorene and acrylic acid): 80 parts by weight Diaryl iodonium salt (trade name: PI2074, manufactured by Rhodia): 5 parts by weight 3-Ethyl-5-[(3-ethyl-2(3H)-benzothiazolilidene)ethylidene]-2-thioxo-4-oxazolidinone (trade name: NK-1473, manufactured by Hayashibara Biochemical Laboratories, Inc.): 2 parts by weight Methanol: 30 parts by weight Methyl ethyl ketone: 30 parts by weight Example 16

A volume hologram was produced in the same conditions as in Example 1 except that the composition of the volume hologram recording photosensitive composition was changed as follows.

<Composition>

Vinyl acetate-acrylic copolymer resin (copolymer of vinyl acetate/ethyl acrylate/acrylic acid (composition ratio=50/45/5)) prepared by radical polymerization in a usually way, weight average molecular weight=100000): 100 parts by weight Fluorine-contained photoreactive compound represented by the following formula (8) (synthesized with reference to methods described in JP-B No. 54-11284, 59-22712 and 6-60116, JP-A No. 2000-336082, J. Fluorine Chem., 73, 151 (1995) and so on): 70 parts by weight

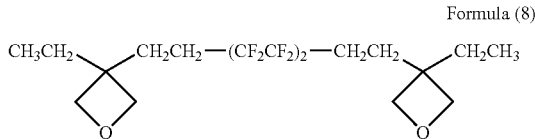

Formula (8)

Trimethylolpropane triacrylate (trade name: A-TMPT, manufactured by Shin-Nakamura Chemical Co., Ltd.): 20 parts by weight 1,6-Hexanediol diglycidyl ether (trade name: DENACOL EX-212, manufactured by Nagase ChemteX Corporation): 30 parts by weight 4,4'-Bis(β-methacryloyloxyethylthio)diphenylsulfone: 80 parts by weight Diaryl iodonium salt (trade name: PI2074, manufactured by Rhodia): 5 parts by weight 3-Ethyl-5-[(3-ethyl-2(3H)-benzothiazolilidene)ethylidene]-2-thioxo-4-oxazolidinone (trade name: NK-1473, manufactured by Hayashibara Biochemical Laboratories, Inc.): 2 parts by weight Methanol: 30 parts by weight Methyl ethyl ketone: 30 parts by weight Example 17

A volume hologram was produced in the same conditions as in Example 1 except that the composition of the volume hologram recording photosensitive composition was changed as follows.

<Composition>

Polyvinyl acetate (weight average molecular weight converted to polystyrene molecular weight=100000): 100 parts by weight Fluorine-contained photoreactive compound represented by the following formula (9) (synthesized with reference to methods described in JP-B No. 54-11284, 59-22712 and 6-60116, J. Fluorine Chem., 73, 151 (1995) and so on): 25 parts by weight

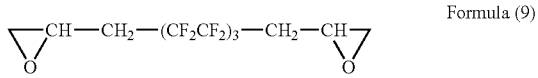

Formula (9)

1,6-Hexanediol diglycidyl ether (trade name: DENACOL EX-212, manufactured by Nagase ChemteX Corporation): 70 parts by weight 9,9-Bis(4-acryloxydiethoxyphenyl)fluorene (trade name: BPEFA, manufactured by Osaka Gas Co., Ltd.): 80 parts by weight Diaryl iodonium salt (trade name: PI2074, manufactured by Rhodia): 5 parts by weight 3-Ethyl-5-[(3-ethyl-2(3H)-benzothiazolilidene)ethylidene]-2-thioxo-4-oxazolidinone (trade name: NK-1473, manufactured by Hayashibara Biochemical Laboratories, Inc.): 2 parts by weight 1-Butanol: 30 parts by weight Methyl ethyl ketone: 30 parts by weight Example 18

A volume hologram was produced in the same conditions as in Example 1 except that the composition of the volume hologram recording photosensitive composition was changed as follows.

<Composition>

Polyvinyl acetate (weight average molecular weight converted to polystyrene molecular weight=100000): 100 parts by weight Fluorine-contained photoreactive compound represented by the following formula (9) (synthesized with reference to methods described in JP-B No. 54-11284, 59-22712 and 6-60116, J. Fluorine Chem., 73, 151 (1995) and so on): 25 parts by weight

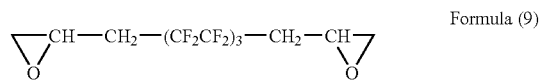

Formula (9)

1,6-Hexanediol diglycidyl ether (trade name: DENACOL EX-212, manufactured by Nagase ChemteX Corporation): 70 parts by weight 9,9-Bis(4-acryloxydiethoxyphenyl)fluorene (trade name: BPEFA, manufactured by Osaka Gas Co., Ltd.): 80 parts by weight Diaryl iodonium salt (trade name: PI2074, manufactured by Rhodia): 5 parts by weight 3,9-Diethyl-3'-carboxymethyl-2,2'-thiacarbocyanine iodonium salt: 1 part by weight 1-Butanol: 30 parts by weight Methyl ethyl ketone: 30 parts by weight Example 19

A volume hologram was produced in the same conditions as in Example 1 except that the composition of the volume hologram recording photosensitive composition was changed as follows and the wavelength for the hologram-exposure was changed from 514.5 nm to 488 nm.

<Composition>

Polyvinyl acetate (weight average molecular weight converted to polystyrene molecular weight=100000): 100 parts by weight Fluorine-contained photoreactive compound represented by the following formula (9) (synthesized with reference to methods described in JP-B No. 54-11284, 59-22712 and 6-60116, J. Fluorine Chem., 73, 151 (1995) and so on): 25 parts by weight

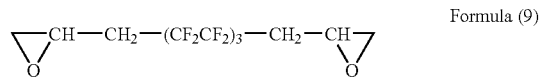

Formula (9)

1,6-Hexanediol diglycidyl ether (trade name: DENACOL EX-212, manufactured by Nagase ChemteX Corporation): 70 parts by weight 9,9-Bis(4-acryloxydiethoxyphenyl)fluorene (trade name: BPEFA, manufactured by Osaka Gas Co., Ltd.): 80 parts by weight Diaryl iodonium salt (trade name: PI2074, manufactured by Rhodia): 5 parts by weight 2,6-Bis(4-dimethylaminobenzilidene)cyclohexanone (manufactured by Midori Kagaku Co., Ltd.): 1 part by weight
1-Butanol: 30 parts by weight
Methyl ethyl ketone: 30 parts by weight Example 20

A volume hologram was produced in the same conditions as in Example 1 except that the composition of the volume hologram recording photosensitive composition was changed as follows.
<Composition>
Polyvinyl acetate (weight average molecular weight converted to polystyrene molecular weight=100000): 100 parts by weight
Fluorine-contained photoreactive compound represented by the following formula (9) (synthesized with reference to methods described in JP-B No. 54-11284, 59-22712 and 6-60116, J. Fluorine Chem., 73, 151 (1995) and so on): 25 parts by weight

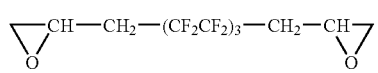

Formula (9)

1,6-Hexanediol diglycidyl ether (trade name: DENACOL EX-212, manufactured by Nagase ChemteX Corporation): 70 parts by weight
9,9-Bis(4-acryloxydiethoxyphenyl)fluorene (trade name: BPEFA, manufactured by Osaka Gas Co., Ltd.): 80 parts by weight
2-Mercaptobenzothiazole (available from Ardrich): 5 parts by weight
2,5-Dinitrobenzyl tosylate: 5 parts by weight
2,5-Bis(4-dipentylaminobenzilidene)cyclopentanone: 1 part by weight
1-Butanol: 30 parts by weight
Methyl ethyl ketone: 30 parts by weight Comparative Example 1

A volume hologram was produced in the same conditions as in Example 1 except that the fluorine-contained photoreactive compound in the volume hologram recording photosensitive composition of Example 1 was changed to polyethylene glycol diacrylate (trade name: A-400, manufactured by Shin-Nakamura Chemical Co., Ltd.).

Comparative Example 2

A volume hologram was produced in the same conditions as in Example 1 except that the fluorine-contained photoreactive compound in the volume hologram recording photosensitive composition of Example 1 was changed to polyethylene glycol diglycidyl ether (trade name: DENACOL EX-821, manufactured by Nagase ChemteX Corporation) and Irgacure 784 was changed to diaryl iodonium salt (trade name: PI2074, manufactured by Rhodia).

Comparative Example 3

A volume hologram was produced under the same conditions as in Example 1 except that the fluorine-contained photoreactive compound in the volume hologram recording photosensitive composition of Example 1 was changed to 1H, 1H, 2H, 2H-heptadecafluorodecyl acrylate (trade name: Viscoat 17F, manufactured by Osaka Organic Chemistry Industry Ltd.). As a result, the hologram recording material layer whitely clouded. Thus, no volume hologram was unable to be recorded.

Comparative Example 4

A volume hologram was produced under the same conditions as in Example 1 except that the fluorine-contained photoreactive compound in the volume hologram recording photosensitive composition of Example 1 was changed to a polyfunctional fluorine-contained photoreactive compound (trade name: ART-3, manufactured by KYOEISYA CHEMICAL Co., Ltd.). As a result, the hologram recording material layer whitely clouded. Thus, no volume hologram was unable to be recorded.

Figure 3:
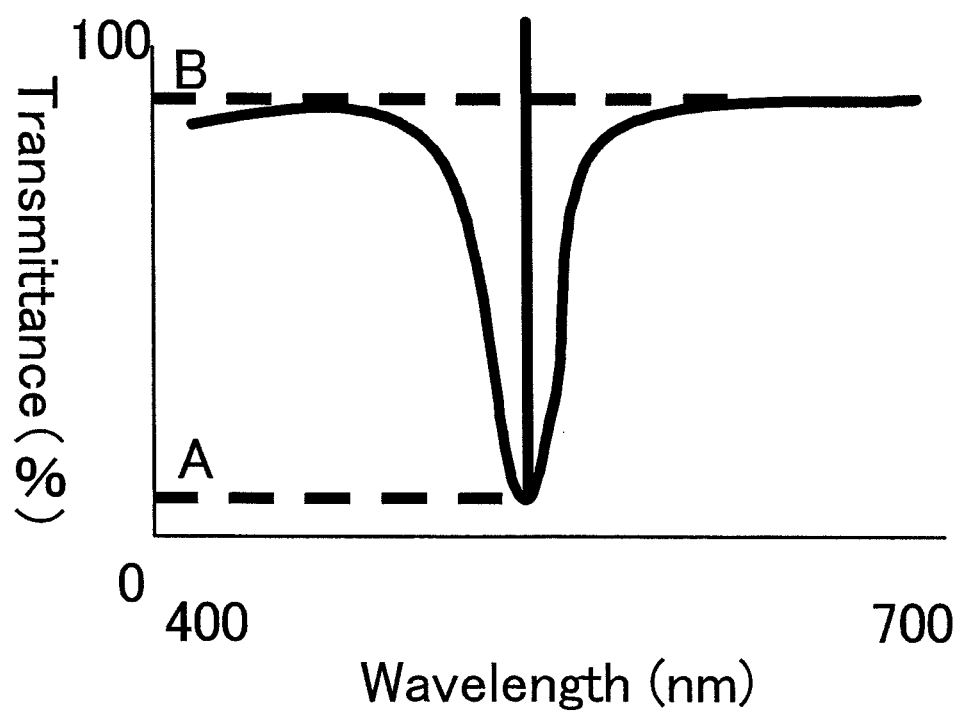
FIG. 3 is a graph showing a method for calculating diffraction efficiency.

2. Evaluation of the Refractive Index Modulation ($\Delta n$):

A spectrophotometer (trade name: UVPC-3100, manufactured by Shimadzu Corporation) was used to measure the transmittance, and the diffraction efficiency $\eta=(B-A)/B$ was calculated by determining the peak transmittance being as "A" and the base transmittance being as "B" in the resultant spectral transmittance curve (see FIG. 3).

From the value of the diffraction efficiency, the refractive index modulation ($\Delta n$) was calculated from the following theoretical equation based on Kogelnik's coupled-wave theory (Bell Syst. Tech. J., 48, 2909 (1969)):

$$\eta = \tan h^2(\pi(\Delta n)d/\lambda \cos \theta_0)$$

wherein d represents the thickness of the photosensitive material layer, $\lambda$ represents the wavelength of the recording laser, and $\theta_0$ represents the incident angle of the recording laser into the photosensitive material.

The evaluation results of the refractive index modulations are shown in Table 1. In each of Examples, the hologram had a large refractive index modulation and was bright. In particular, in Example 17 using the fluorine-contained photoreactive compound represented by the formula (9), an especially large refractive-index modulation was obtained.

TABLE 1

|  | Refractive index modulation ($\Delta n$) |
| --- | --- |
| Example 1 | 0.023 |
| Example 2 | 0.031 |
| Example 3 | 0.028 |
| Example 4 | 0.016 |
| Example 5 | 0.025 |
| Example 6 | 0.023 |
| Example 7 | 0.024 |
| Example 8 | 0.036 |
| Example 9 | 0.032 |
| Example 10 | 0.036 |
| Example 11 | 0.021 |
| Example 12 | 0.026 |
| Example 13 | 0.028 |
| Example 14 | 0.031 |
| Example 15 | 0.033 |
| Example 16 | 0.031 |
| Example 17 | 0.07 |
| Example 18 | 0.035 |
| Example 19 | 0.03 |
| Example 20 | 0.04 |
| Comparative Example 1 | 0.007 |
| Comparative Example 2 | 0.008 |

TABLE 1-continued

| | Refractive index modulation (Δn) |
|---|---|
| Comparative Example 3 | Cloudiness |
| Comparative Example 4 | Cloudiness |

We claim:

1. A hologram transfer foil in which a peelable layer, a hologram layer and an adhesive layer are successively laid on one surface of a support, wherein the hologram layer is formed using a photosensitive composition comprising a binder resin containing an organic-inorganic hybrid polymer and a fluorine-containing photoreactive compound represented by the following formula (1):

$$R^1-R^3-(CF_2)n\text{-}R^4-R^2 \quad \text{Formula (1)}$$

wherein each of $R^1$ and $R^2$ is independently an epoxy group or an oxetanyl group, and each of $R^3$ and $R^4$ is independently a single bond or a bivalent hydrocarbon group having 1 to 5 carbon atoms, and n is an integer of 1 or more.

2. The hologram transfer foil according to claim 1, wherein each of $R^1$ and $R^2$ is an epoxy group.

3. The hologram transfer foil according to claim 1, wherein each of $R^1$ and $R^2$ in the formula (1) is an oxetanyl group represented by the following formula (2):

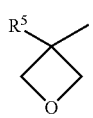

Formula (2)

wherein $R^5$ is a hydrogen atom or an alkyl group having 1 to 10 carbon atoms.

4. The hologram transfer foil according to claim 1, wherein each of $R^3$ and $R^4$ in the formula (1) is independently a single bond or a linear hydrocarbon group.

5. The hologram transfer foil according to claim 1, wherein the photosensitive composition further comprises a photopolymerization initiator.

6. The hologram transfer foil according to claim 1, wherein the photosensitive composition further comprises a second refractive index modulating component other than the fluorine-containing photoreactive compound.

7. The hologram transfer foil according to claim 1, wherein a combination of the photosensitive composition is any one selected from the group consisting of the following (1) to (3):

(1) a combination comprising the fluorine-containing photosensitive compound represented by the formula (1), a binder resin having a refractive index different from that of the fluorine-containing photosensitive compound, and a radical photopolymerizable compound which is the second refractive index modulating component having a refractive index different from that of the fluorine-containing photosensitive compound;

(2) a combination comprising the fluorine-containing photosensitive compound represented by the formula (1), a binder resin having a refractive index different from that of the fluorine-containing photosensitive compound, and a cationic photopolymerizable compound which is the second refractive index modulating component having a refractive index different from that of the fluorine-containing photosensitive compound;

(3) a combination comprising the fluorine-containing photosensitive compound represented by the formula (1), a binder resin having a refractive index different from that of the fluorine-containing photosensitive compound, a radical photopolymerizable compound which is the second refractive index modulating component having a refractive index different from that of the fluorine-containing photosensitive compound, and a cationic photopolymerizable compound which is the second refractive index modulating component having a refractive index different from that of the fluorine-containing photosensitive compound.

8. The hologram transfer foil according to claim 1, wherein the photosensitive composition further comprises metal fine particles having a refractive index different from that of the fluorine-containing photosensitive compound represented by the formula (1).

9. The hologram transfer foil according to claim 1, wherein the photosensitive composition further comprises a sensitizing dye which gets transparent by light-exposure or treatment after the light-exposure.

10. The hologram transfer foil according to claim 9, wherein the sensitizing dye is at least one selected from the group consisting of cyanine type dyes, merocyanine type dyes, coumarin type dyes, ketocoumarin type dyes, and cyclopentanone type dyes.

11. The hologram transfer foil according to claim 1, wherein the photosensitive composition further comprises a fluorene skeleton-containing photopolymerizable compound having a refractive index different from that of the fluorine-containing photosensitive compound represented by the formula (1).

12. A method for producing a hologram transfer foil, in which a peelable layer, a hologram layer and an adhesive layer are successively laid on one surface of a support, wherein the hologram layer is formed by forming a hologram recording material layer using a photosensitive composition comprising a binder resin containing an organic-inorganic hybrid polymer and a fluorine-containing photoreactive compound represented by the following formula (1):

$$R^1-R^3-(CF_2)n\text{-}R^4-R^2 \quad \text{Formula (1)}$$

wherein each of $R^1$ and $R^2$ is independently an epoxy group or an oxetanyl group, and each of $R^3$ and $R^4$ is independently a single bond or a bivalent hydrocarbon group having 1 to 5 carbon atoms, and n is an integer of 1 or more, and by subjecting the hologram recording material layer to hologram-exposure.

13. A hologram transfer foil in which a peelable layer, a hologram layer and an adhesive layer are successively laid on one surface of a support, wherein the hologram layer is formed using a photosensitive composition comprising a binder resin containing an organic-inorganic hybrid polymer and a fluorine-containing photoreactive compound represented by the following formula (1):

$$R^1-R^3-(CF_2)n\text{-}R^4-R^2 \quad \text{Formula (1)}$$

wherein each of $R^1$ and $R^2$ is independently an acryloyl group or a methacryloyl group, and each of $R^3$ and $R^4$ is independently a single bond or a bivalent hydrocarbon group having 1 to 5 carbon atoms, and n is an integer of 1 or more.

14. A method for producing a hologram transfer foil, in which a peelable layer, a hologram layer and an adhesive layer are successively laid on one surface of a support, wherein the hologram layer is formed by forming a hologram recording material layer using a photosensitive composition comprising a binder resin containing an organic-inorganic hybrid polymer and a fluorine-containing photoreactive compound represented by the following formula (1):

Formula (1)

wherein each of $R^1$ and $R^2$ is independently an acryloyl group or a methacryloyl group, and each of $R^3$ and $R^4$ is independently a single bond or a bivalent hydrocarbon group having 1 to 5 carbon atoms, and n is an integer of 1 or more, and by subjecting the hologram recording material layer to hologram-exposure.

\* \* \* \* \*